(12) United States Patent
Liu et al.

(10) Patent No.: US 10,790,155 B2
(45) Date of Patent: Sep. 29, 2020

(54) METHOD OF MANUFACTURING SEMICONDUCTOR DEVICES

(71) Applicant: TAIWAN SEMICONDUCTOR MANUFACTURING CO., LTD., Hsinchu (TW)

(72) Inventors: Ru-Gun Liu, Zhubei (TW); Chih-Ming Lai, Hsinchu (TW); Wei-Liang Lin, Hsinchu (TW); Yung-Sung Yen, New Taipei (TW); Ken-Hsien Hsieh, Taipei (TW); Chin-Hsiang Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/240,402

(22) Filed: Jan. 4, 2019

(65) Prior Publication Data

US 2020/0006078 A1     Jan. 2, 2020

Related U.S. Application Data

(60) Provisional application No. 62/690,817, filed on Jun. 27, 2018.

(51) Int. Cl.
*H01L 21/311*     (2006.01)
*H01L 21/027*     (2006.01)
*H01L 21/768*     (2006.01)

(52) U.S. Cl.
CPC .... *H01L 21/31116* (2013.01); *H01L 21/0274* (2013.01); *H01L 21/31144* (2013.01); *H01L 21/76816* (2013.01); *H01L 21/76877* (2013.01)

(58) Field of Classification Search
None
See application file for complete search history.

(56) References Cited

U.S. PATENT DOCUMENTS

| | | | | |
|---|---|---|---|---|
| 6,358,861 B1* | 3/2002 | Ohji | | B81C 1/00547 257/E21.216 |
| 7,638,398 B2* | 12/2009 | Cho | | H01L 21/84 257/259 |
| 2006/0063385 A1* | 3/2006 | Maruyama | | H01L 21/32132 438/710 |
| 2009/0111274 A1* | 4/2009 | Noelscher | | H01L 21/3065 438/705 |
| 2010/0055917 A1* | 3/2010 | Kim | | H01L 21/3065 438/706 |
| 2011/0034031 A1* | 2/2011 | Kanamori | | B81C 1/00484 438/705 |
| 2013/0210228 A1 | 8/2013 | Tran | | |
| 2014/0273456 A1 | 9/2014 | Shieh et al. | | |
| 2017/0110331 A1* | 4/2017 | Joshi | | H01L 21/3063 |
| 2017/0110579 A1* | 4/2017 | Chang | | H01L 29/66636 |
| 2018/0090370 A1 | 3/2018 | Hung et al. | | |
| 2018/0373160 A1* | 12/2018 | Lerner | | H01L 21/7806 |

FOREIGN PATENT DOCUMENTS

KR     10-2009-0089497 A     8/2009

* cited by examiner

*Primary Examiner* — Shamim Ahmed
(74) *Attorney, Agent, or Firm* — McDermott Will & Emery LLP

(57) ABSTRACT

In a method of forming a groove pattern extending in a first axis in an underlying layer over a semiconductor substrate, a first opening is formed in the underlying layer, and the first opening is extended in the first axis by directional etching to form the groove pattern.

20 Claims, 23 Drawing Sheets

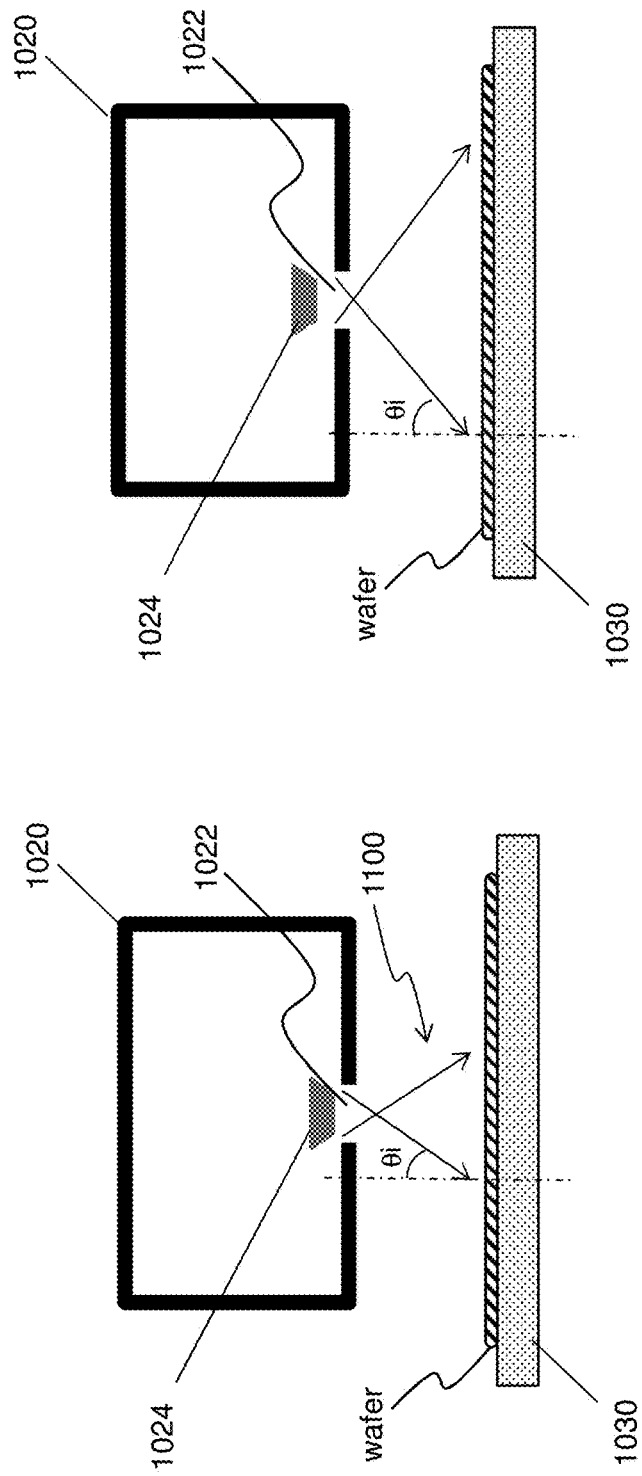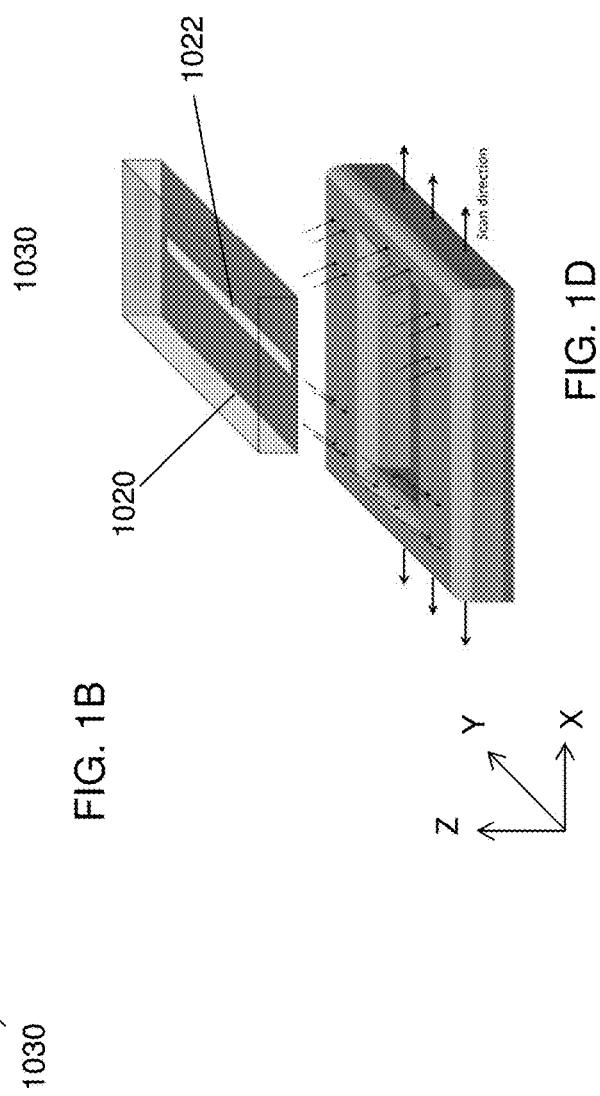
FIG. 1B
FIG. 1C
FIG. 1D

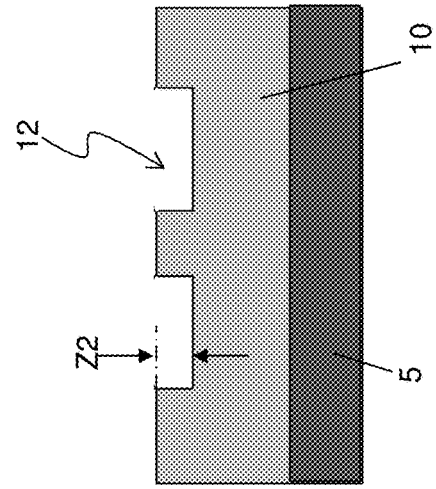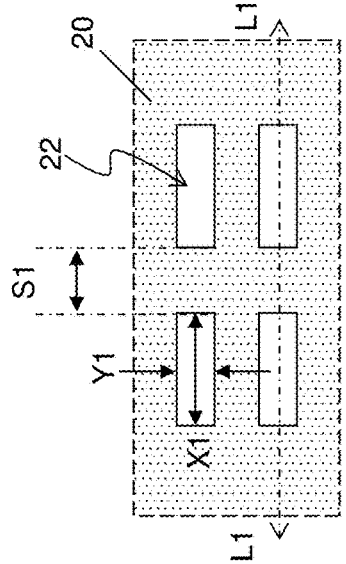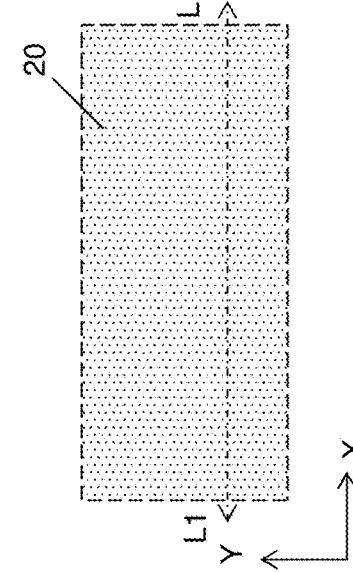
FIG. 2A  FIG. 3A  FIG. 4A
FIG. 2B  FIG. 3B  FIG. 4B

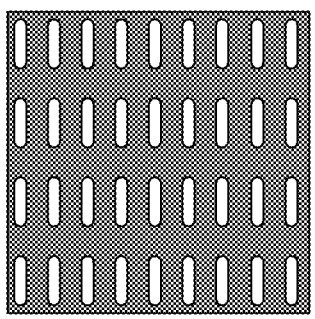
FIG. 13A
FIG. 13B
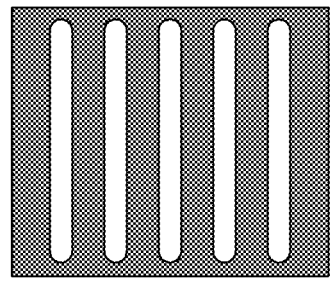
FIG. 13E
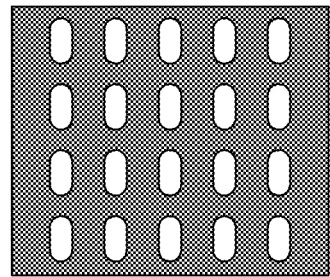
FIG. 13D
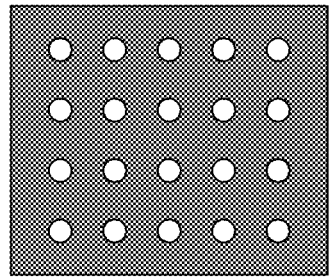
FIG. 13C

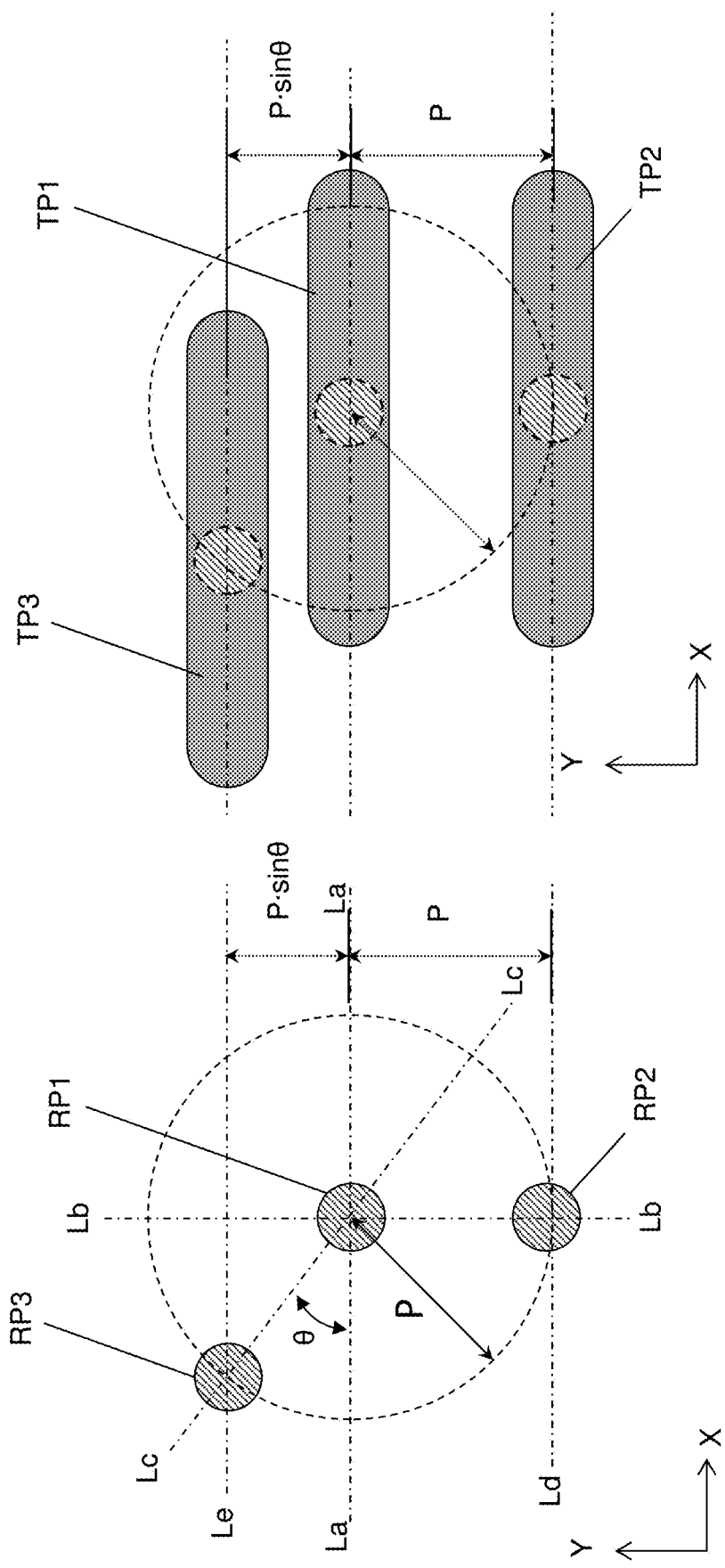

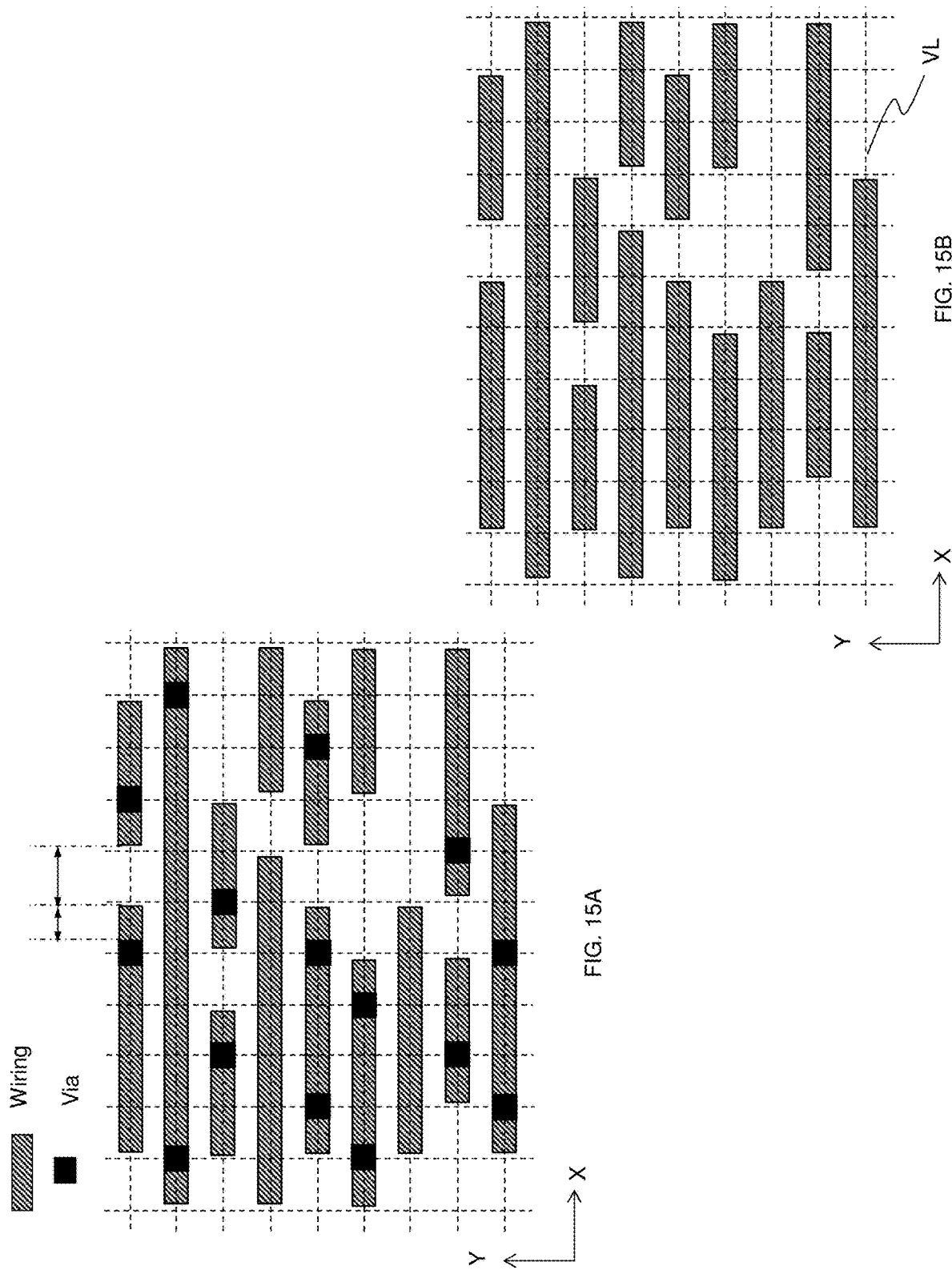

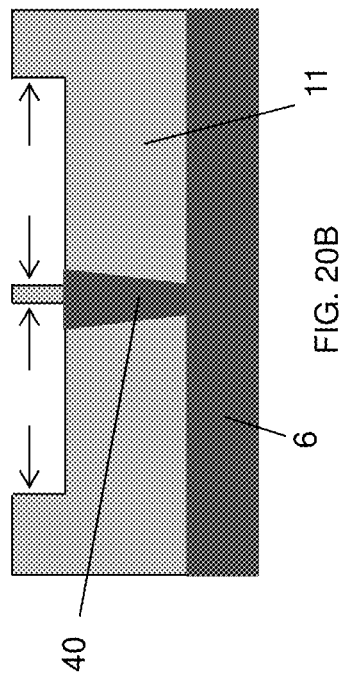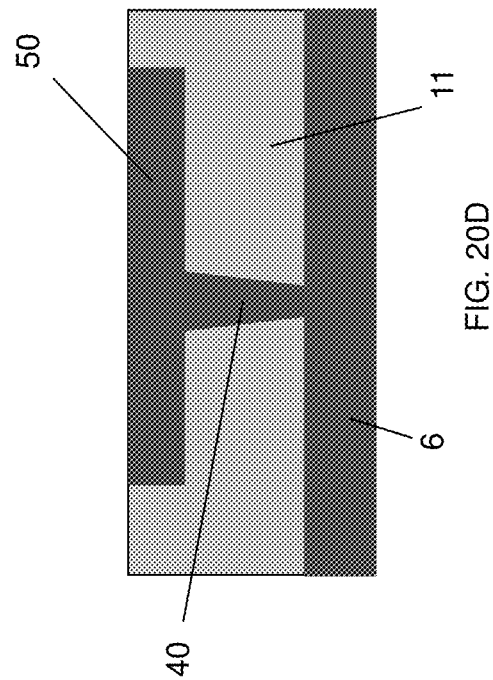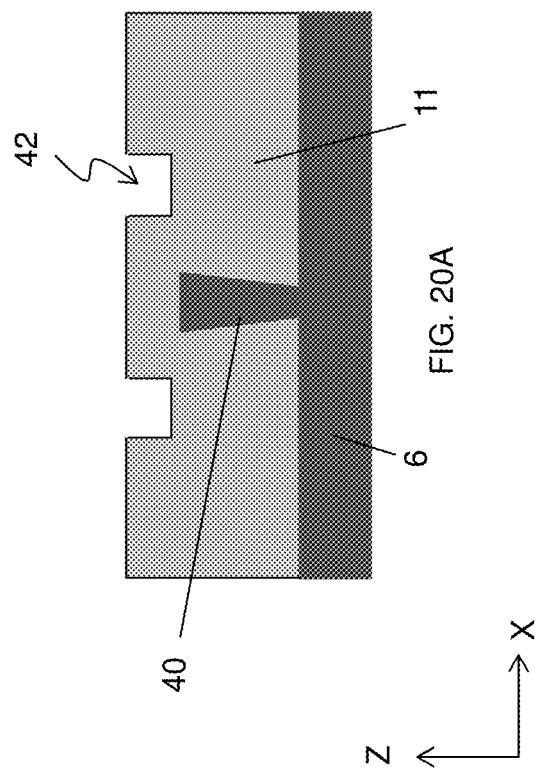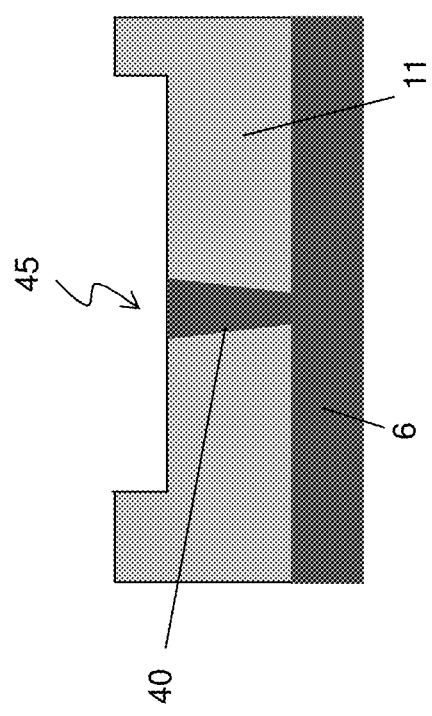

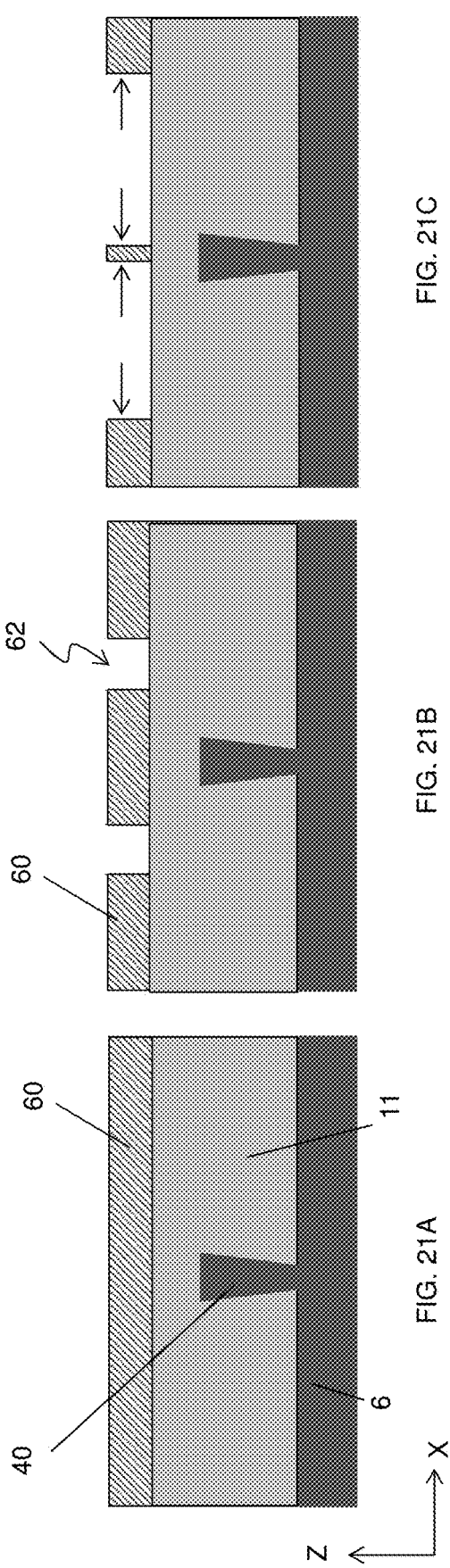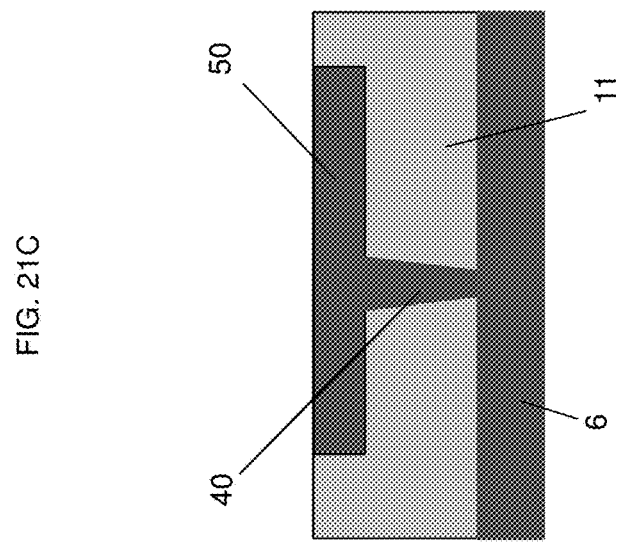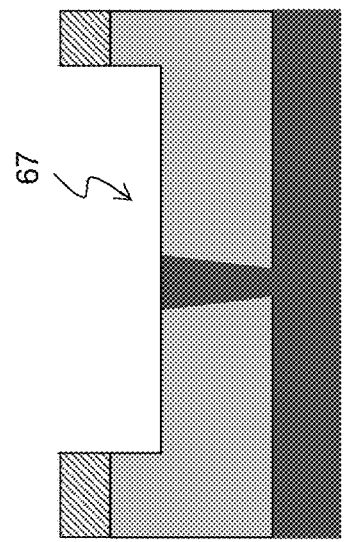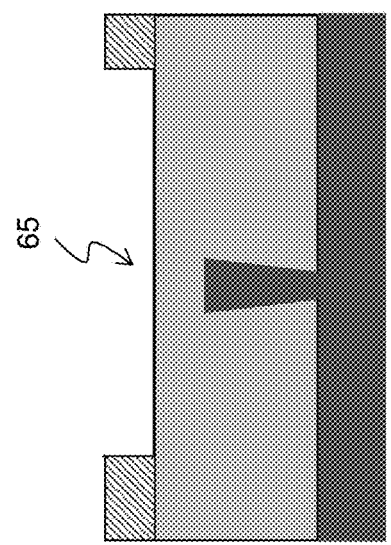

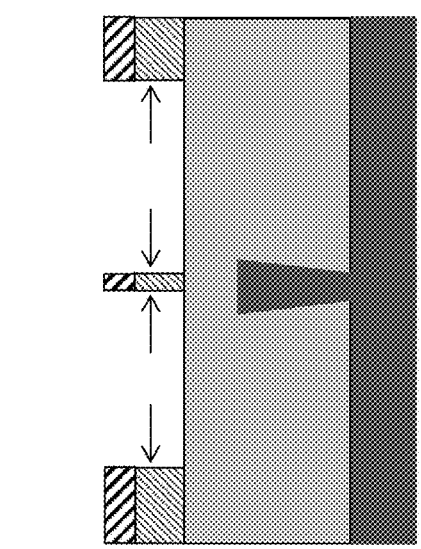
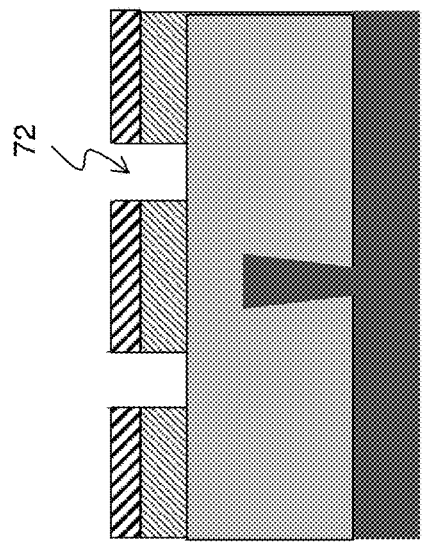
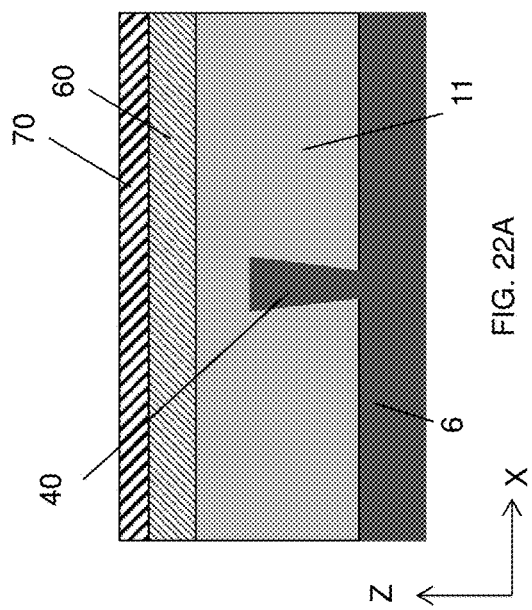
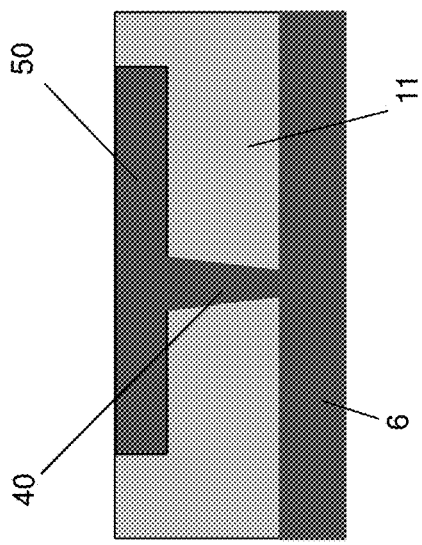
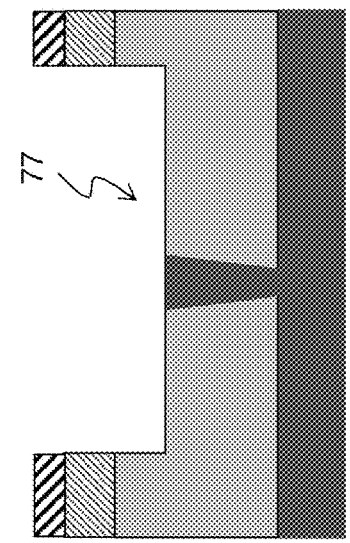
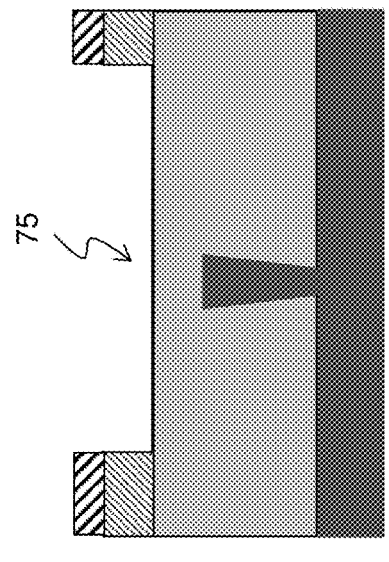

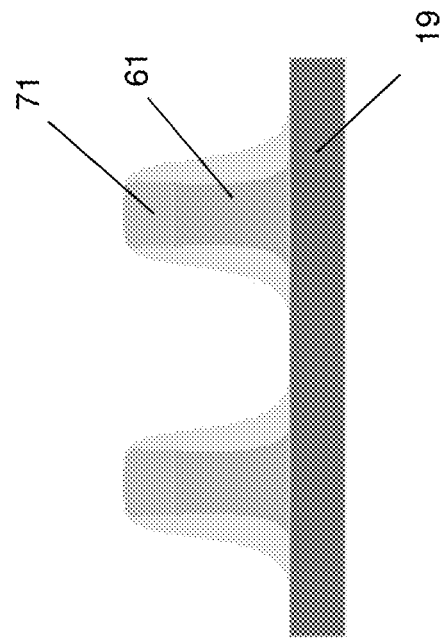
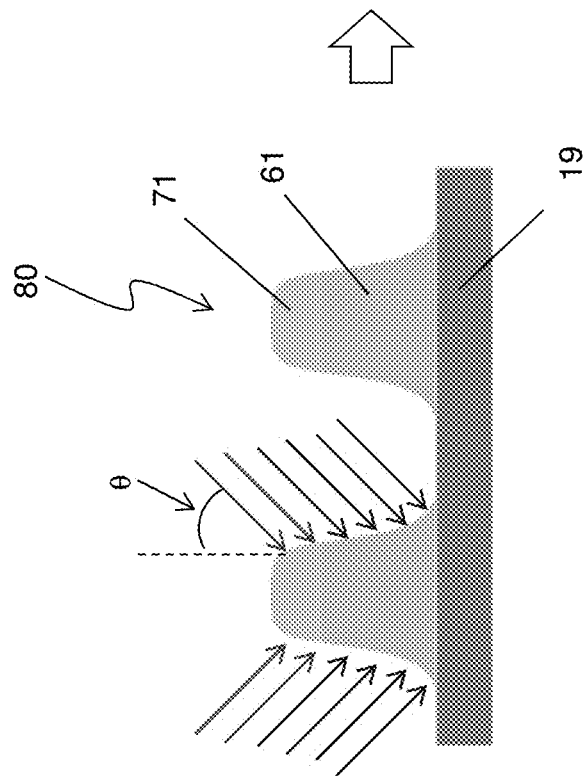
FIG. 23B
FIG. 23A

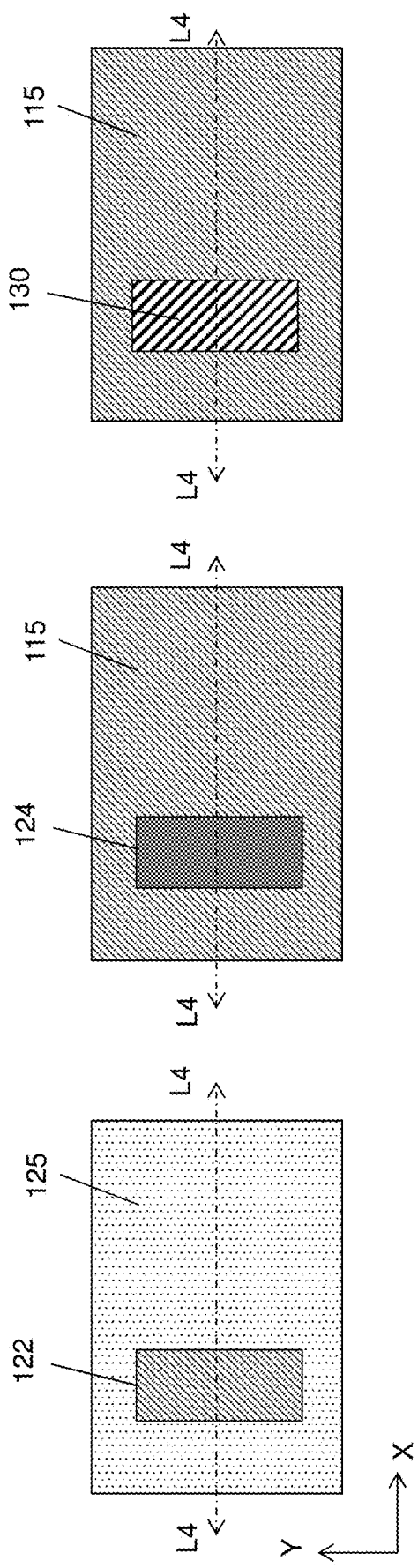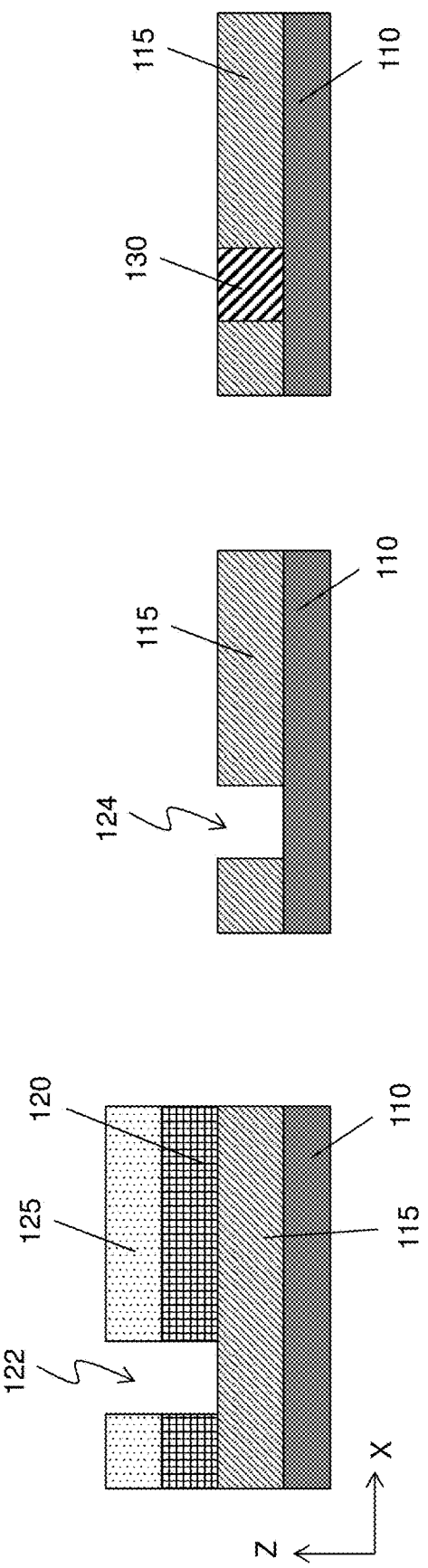

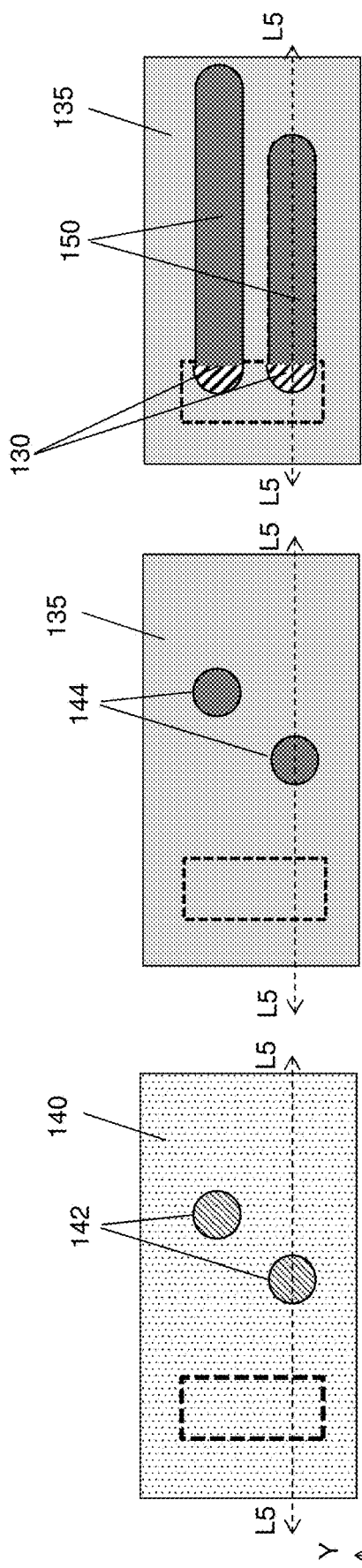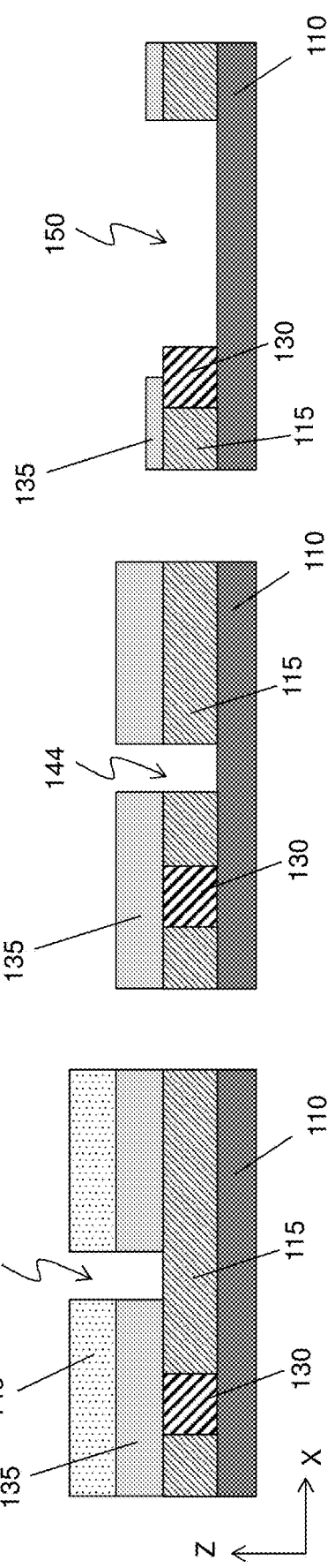

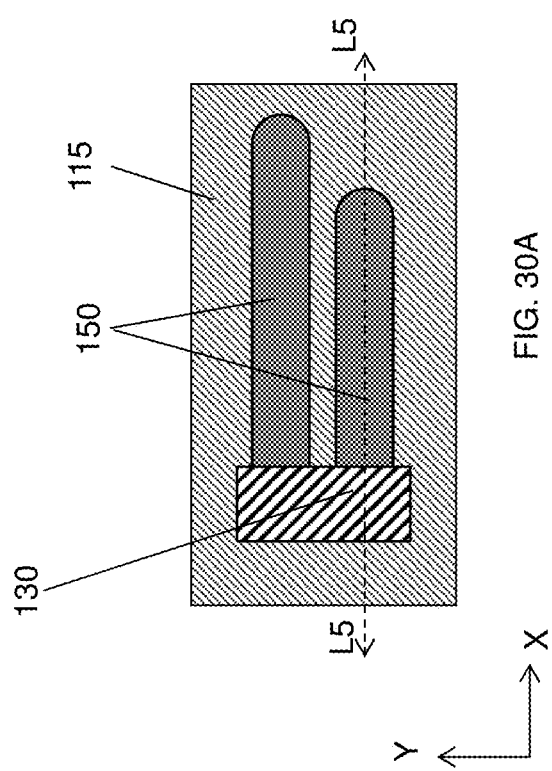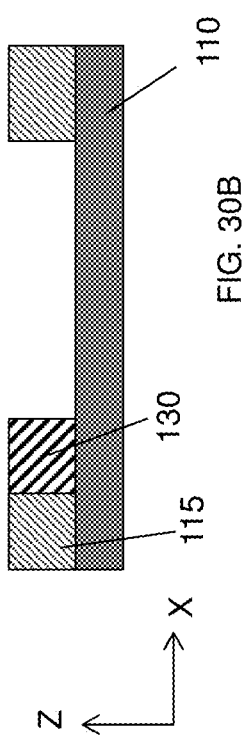

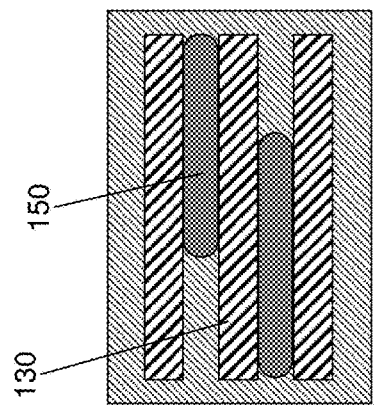
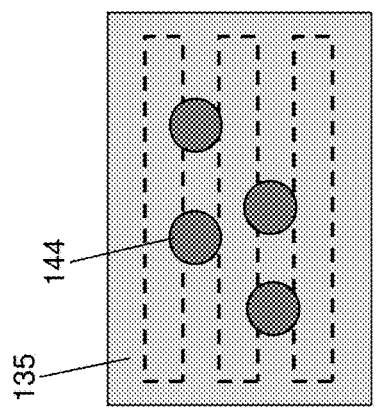
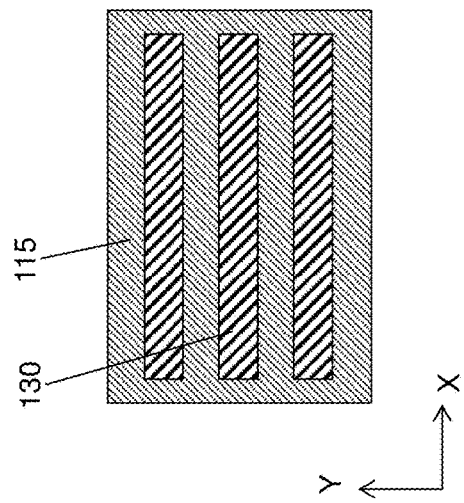
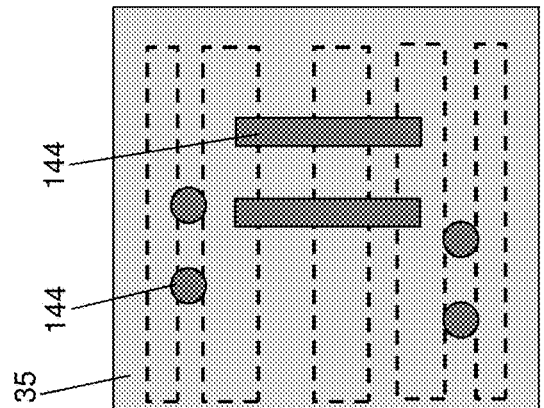
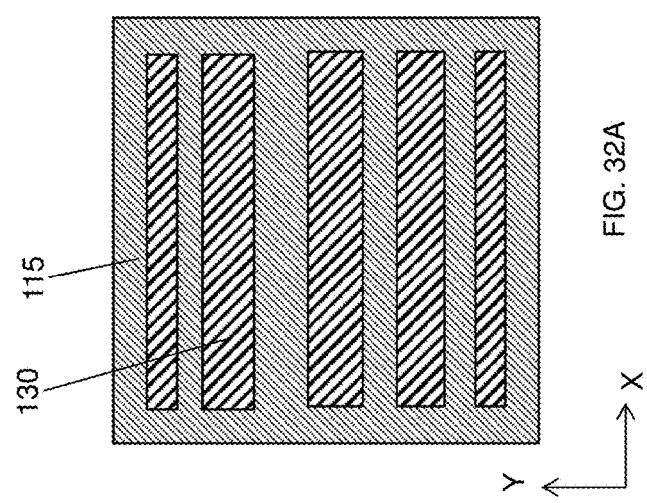

METHOD OF MANUFACTURING SEMICONDUCTOR DEVICES

RELATED APPLICATIONS

This application claims priority of U.S. Provisional patent application No. 62/690,817 filed Jun. 27, 2018, the entire contents of which are incorporated herein by reference.

BACKGROUND

At semiconductor technology nodes of 7 nm or smaller, line-and-space (L/S) patterning requires pitch resolution in optical lithography smaller than about 32 nm. In general, even if extreme ultra violet (EUV) lithography is employed, the resolution limitation by EUV single-exposure technology (SPT) is about 28 nm to about 34 nm. To obtain smaller pitch patterns, a double-patterning technology (DPT) with twice repeating lithography exposure processes will be needed for patterning of a L/S pitch smaller than about 32 nm. However, the cost of EUV with the DPT approach would be too expensive for a mass-production application.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1B, 1C and 1D show schematic views of directional patterning in accordance with an embodiment of the present disclosure.

FIG. 2A illustrates a plan view of one of the various stages of manufacturing operations in accordance with an embodiment of the present disclosure. FIG. 2B illustrates a cross sectional view corresponding to line L1-L1 of FIG. 2A.

FIG. 3A illustrates a plan view of one of the various stages of manufacturing operations in accordance with an embodiment of the present disclosure. FIG. 3B illustrates a cross sectional view corresponding to line L1-L1 of FIG. 3A.

FIG. 4A illustrates a plan view of one of the various stages of manufacturing operations in accordance with an embodiment of the present disclosure. FIG. 4B illustrates a cross sectional view corresponding to line L1-L1 of FIG. 4A.

FIGS. 13A and 13B show plan views of patterns in accordance with an embodiment of the present disclosure.

FIGS. 13C, 13D and 13E show plan views of patterns in accordance with an embodiment of the present disclosure.

FIGS. 14A and 14B show schematic plan views of the various stages of manufacturing operations in accordance with an embodiment of the present disclosure.

FIG. 15A shows a layout of a semiconductor device in accordance with an embodiment of the present disclosure. FIG. 15B shows a layout of a semiconductor device in accordance with an embodiment of the present disclosure.

FIGS. 20A, 20B, 20C and 20D illustrate cross sectional views of the various stages of manufacturing operations in accordance with an embodiment of the present disclosure.

FIGS. 21A, 21B, 21C, 21D, 21E and 21F illustrate cross sectional views of the various stages of manufacturing operations in accordance with an embodiment of the present disclosure.

FIGS. 22A, 22B, 22C, 22D, 22E and 22F illustrate cross sectional views of the various stages of manufacturing operations in accordance with an embodiment of the present disclosure.

FIGS. 23A and 23B illustrate cross sectional views of the various stages of manufacturing operations in accordance with an embodiment of the present disclosure.

FIG. 24A illustrates a plan view of one of the various stages of manufacturing operations in accordance with an embodiment of the present disclosure. FIG. 24B illustrates a cross sectional view corresponding to line L4-L4 of FIG. 24A.

FIG. 25A illustrates a plan view of one of the various stages of manufacturing operations in accordance with an embodiment of the present disclosure. FIG. 25B illustrates a cross sectional view corresponding to line L4-L4 of FIG. 25A.

FIG. 26A illustrates a plan view of one of the various stages of manufacturing operations in accordance with an embodiment of the present disclosure. FIG. 26B illustrates a cross sectional view corresponding to line L4-L4 of FIG. 26A.

FIG. 27A illustrates a plan view of one of the various stages of manufacturing operations in accordance with an embodiment of the present disclosure. FIG. 27B illustrates a cross sectional view corresponding to line L5-L5 of FIG. 27A.

FIG. 28A illustrates a plan view of one of the various stages of manufacturing operations in accordance with an embodiment of the present disclosure. FIG. 28B illustrates a cross sectional view corresponding to line L5-L5 of FIG. 28A.

FIG. 29A illustrates a plan view of one of the various stages of manufacturing operations in accordance with an embodiment of the present disclosure. FIG. 29B illustrates a cross sectional view corresponding to line L5-L5 of FIG. 29A.

FIG. 30A illustrates a plan view of one of the various stages of manufacturing operations in accordance with an embodiment of the present disclosure. FIG. 30B illustrates a cross sectional view corresponding to line L5-L5 of FIG. 30A.

FIGS. 31A, 31B and 31C illustrate plan views of the various stages of manufacturing operations in accordance with an embodiment of the present disclosure.

FIGS. 32A, 32B and 32C illustrate plan views of the various stages of manufacturing operations in accordance with an embodiment of the present disclosure.

DETAILED DESCRIPTION

Figure 1A:
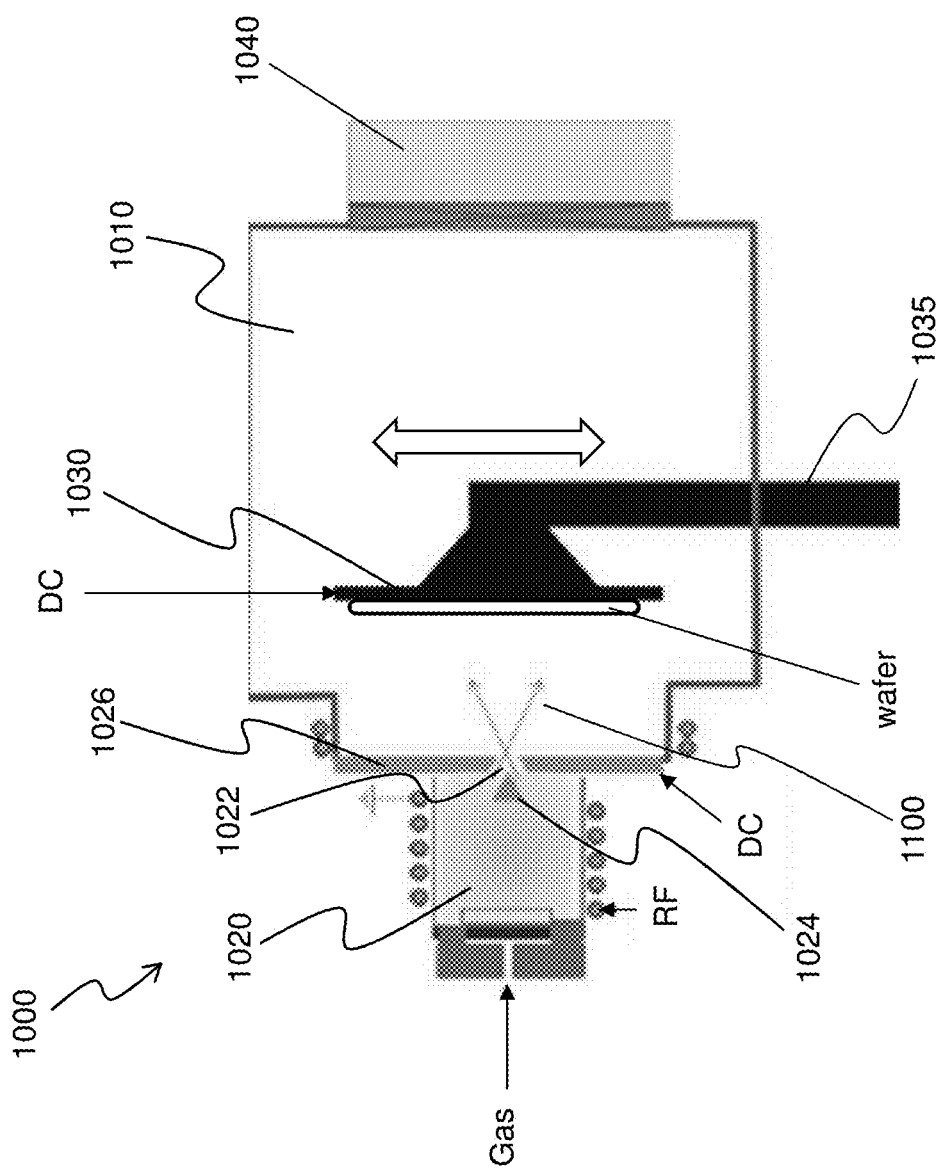
FIG. 1A shows a schematic view of a directional patterning apparatus in accordance with an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations inbetween the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

Disclosed embodiments relate to a semiconductor device, in particular, a complementary metal-oxide-semiconductor field effect transistor (CMOS FET), for example, a fin field effect transistor (FinFET) and its manufacturing method. The embodiments such as those disclosed herein are generally applicable not only to FinFETs but also to a planar FET, a double-gate FET, a surround-gate FET, an omega-gate FET or gate-all-around (GAA) FET, and/or a nanowire FET, or any suitable device having a three-dimensional channel structure.

In the present disclosure, a directional patterning technique using a single-exposure patterning technology (SPT) will be explained to obtain a pattern pitch smaller than the lithography resolution limit, e.g., smaller than about 32 nm.

A directional patterning technique includes a directional etching technique and a directional deposition technique. The directional etching can be characterized as horizontal or surface anisotropic or selective etching, in which a target layer or pattern is etched substantially only one direction (e.g., X direction) within a plane (X-Y plane) parallel to a substrate, substantially without etching another direction (e.g., Y direction).

A directional etching can be performed by tuning various etching parameters to generate etching species (free radicals) that travel in a substantially horizontal direction or that incident on the substrate with a large incident angle of more than about 10-30 degrees (where the angle of 90 degrees is horizontal). The etching parameters to be tuned include, but are not limited to, etchant (gas) composition, etching temperature, etching time, etching pressure, radio frequency (RF) bias voltage, RF bias power, etchant flow rate, wafer tilting, other suitable etching parameters, or combinations thereof.

FIG. 1A shows a schematic view of a directional patterning apparatus, and FIGS. 1B, 1C and 1D show schematic views of directional patterning in accordance with an embodiment of the present disclosure.

As shown in FIG. 1A, the directional patterning apparatus, for example, a directional etching apparatus 1000 includes a main chamber 1010 in which a wafer stage 1030 for a wafer to be processed is disposed, and a plasma generation chamber 1020 for generating plasma. In some embodiments, the plasma is RF (radio frequency) generated plasma, using a high frequency power supply at 13.56 MHz and/or 2.45 GHz. Other frequency ranges may be used. A separation plate 1026 is disposed between the main chamber 1010 and the plasma chamber 1020. The separation plate 1026 includes a slit 1022 from which plasma beams 1100 are introduced into the main chamber. In some embodiments, an adjustable meniscus 1024 is provided over the slit 1022 in the plasma chamber side. One or more vacuum systems 1040 including, for example, a turbo molecular pump, is coupled to the main chamber and to the plasma chamber (not shown) to maintain reduced pressure states in the chambers. In some embodiments, during the etching process, the pressure in the main chamber is lower than the pressure in the plasma chamber. In certain embodiments, the pressure in the main chamber is in the order to $1 \times 10^{-5}$ Torr, and the pressure in the plasma chamber is in the order to $1 \times 10^{-3}$ Torr.

In some embodiments, the separation plate 1026 and the wafer stage 1030 are biased by DC voltage, respectively, to extract and control the plasma beams 1100. Further, the wafer stage 1030 is movable by a moving mechanism 1035 to scan the wafer relative to the plasma beams 1100.

In some embodiments, at least one of RF and DC bias voltages is tuned to achieve an electric field that causes etching species to flow substantially horizontally along an in-plane direction (for example, in the X direction) relative to a surface over the substrate, or to provide a large incident angle. In some embodiments, the etching species are tuned to have a profile of momenta of the energetic species such that the momenta of the etching species or energetic species along a frontline are not the same, i.e., the momentum of an etching or energetic species on the top path is different from the momentum of an etching or energetic species on the bottom path. In some embodiments, the momentum of an etching or energetic species on the top path is different from the momentum of an etching or energetic species in the middle path above the bottom path, and the momentum of the etching or energetic species on the top path is the same as or different from the momentum of an etching or energetic species on the bottom path. Any combinations can be achieved by adjustment of the electromagnetic control to tune the energies of the etching or energetic species alone the etching front.

In some embodiments, as shown in FIGS. 1B and 1C, a position of the meniscus 1024 is adjusted to change the incident angle θi of the plasma beams 1100. As shown in FIG. 1D, by scanning the wafer along the X direction, a groove pattern can be formed without substantially expanding the groove in the Y direction.

In some embodiments, a ratio of an amount of etching in the X direction to an amount of etching in the Y direction is about 2 or more, and is about 5 or more in other embodiments. In certain embodiments, the ratio is about 10 or more. Ideally, the ratio is as high as possible, but it can be up to about 100 in some embodiments and up to about 50 in other embodiments. Further, an amount of etching along the Z direction (vertical direction) is smaller than the amount of etching in the X direction. In some embodiments, a ratio of an amount of etching in the X direction to an amount of etching in the Z direction is about 2 or more, and is about 5 or more in other embodiments. In certain embodiments, the ratio is about 10 or more. Ideally, the ratio is as high as possible, but it can be up to about 100 in some embodiments and up to about 50 in other embodiments.

FIGS. 2A-6B shows plan views and cross sectional views of various stages for manufacturing a semiconductor device in accordance with an embodiment of the present disclosure. It is understood that additional operations can be provided before, during, and after processes shown by FIGS. 2A-6B, and some of the operations described below can be replaced or eliminated, for additional embodiments of the method. The order of the operations/processes may be interchangeable. In FIGS. 2A-6B, the "A" figures are plan views (viewed from the above) and the "B" figures are cross sectional views corresponding to line L1-L1 of FIGS. 1A-3A.

As shown in FIGS. 2A and 2B, a mask pattern 20 is formed over a target layer 10. In some embodiments, the target layer 10 is formed over a substrate 5. In some embodiments, the substrate 5 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 100 may include an epitaxial layer (epi-layer), which may be strained for performance enhancement, and/or may include a silicon-on-insulator (SOI) structure. In one embodiment, a p-type silicon substrate is used.

The target layer 10 is one or more layers of a conductive material and/or a dielectric material. In some embodiments, the target layer 10 includes a dielectric material, such as silicon oxide, silicon nitride, SiON, SiOC, SiOCN, SiCN, aluminum based dielectric material, low-k material, organic material, or any other dielectric material used in a semiconductor device fabrication. In one embodiment, a silicon oxide is used.

The mask layer 20 is a photo resist layer in some embodiments, and can be a hard mask layer made of different material than the target layer 10 in other embodiments.

Then, as shown in FIGS. 3A and 3B, the photo resist layer 20 is patterned by using a lithography operation including resist developing. As shown in FIGS. 3A and 3B, opening patterns (spaces or tranches) 22 are formed in the photo resist layer 20. In some embodiments, the lithography operation is a single exposure patterning process using one of an EUV light source, an electron beam, an ArF laser light source or a KrF laser light source. As shown in FIG. 3A, the opening 22 has a length X1 (the maximum length) along the X direction and a width Y1 (the maximum width) along the Y direction. In some embodiments, X1 is greater than Y1. As shown in FIG. 3A, two adjacent openings 22 are separated by a distance S1, which is equal to or greater than the resolution limit of a single exposure lithography operation.

Then, one or more etching operations are performed to etch a surface portion of the target layer 10 to form trenches 12, and then the mask layer 20 is removed, as shown in FIGS. 4A and 4B. The etching operations include dry etching and/or wet etching. As shown in FIGS. 4A and 4B, the trench 12 has a length X2, a width Y2 and a depth Z2 along the Z direction.

Figure 5A:
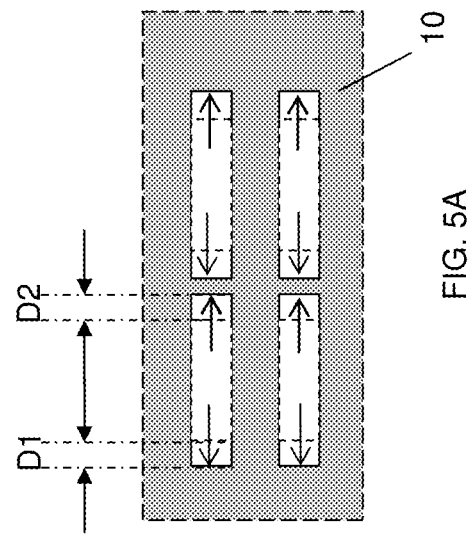
FIG. 5A illustrates a plan view of one of the various stages of manufacturing operations in accordance with an embodiment of the present disclosure.
Figure 5B:
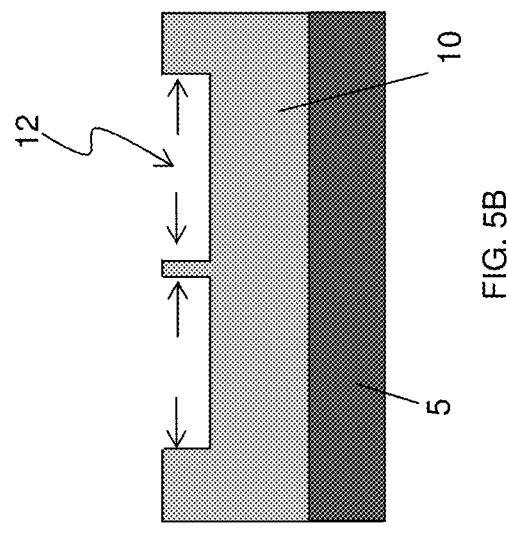
FIG. 5B illustrates a cross sectional view corresponding to line L1-L1 of FIGS. 2A-4A.

Next, as shown in FIGS. 5A and 5B, one or more directional etching operations are performed to selectively etch the left edges and the right edges (short sides) of the trenches 12. By the directional etching in the X direction, the left and right edges of the trenches 12 are etched by an amount D1 and D2, respectively. In the directional etching, the bottoms of the trenches 12, the long sides of the trenches 12 and/or the right edges of the trenches 12 are also slightly etched in some embodiments. In some embodiments, D1 is equal to D2 and in other embodiments, D1 is different from D2.

Figure 6A:
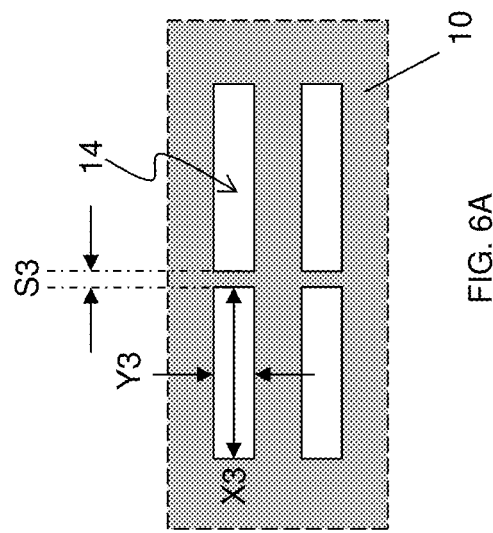
FIG. 6A illustrates a plan view of one of the various stages of manufacturing operations in accordance with an embodiment of the present disclosure.
Figure 6B:
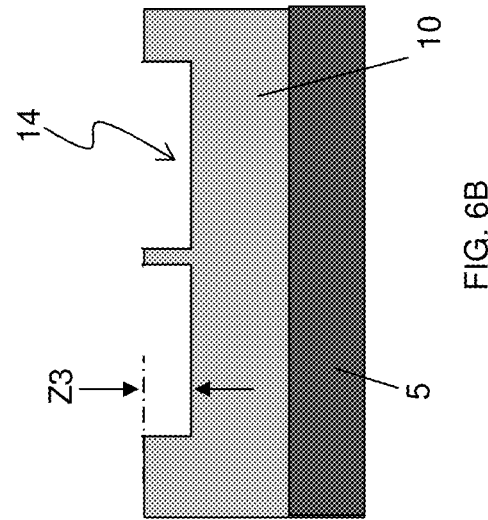
FIG. 6B illustrates a cross sectional view corresponding to line L1-L1 of FIGS. 2A-4A.

By the one or more directional etching operations, modified trenches 14 as shown in FIGS. 6A and 6B can be obtained. As shown in FIGS. 6A and 6B, the modified trench 14 has a length X3, a width Y3 and a depth Z3 along the Z direction. The length X3 is equal to X2+D1+D2. The difference Dy between widths Y3 and Y2 is equal to or greater than zero and smaller than (D1+D2)/2. In some embodiments, (D1+D2)/2 is two times or more, five times or more, or ten times or more Dy. In some embodiments, Z3 is greater than Z2 and ½ or less, ⅕ or less or 1/10 or less (D1+D2)/2. After the directional etching operations, a space S3 between adjacent trenches in the X direction can be smaller than the resolution limit of the single exposure lithography operation.

FIGS. 7A-9B shows plan views and cross sectional views of various stages for manufacturing a semiconductor device in accordance with another embodiment of the present disclosure. It is understood that additional operations can be provided before, during, and after processes shown by FIGS. 7A-9B, and some of the operations described below can be replaced or eliminated, for additional embodiments of the method. The order of the operations/processes may be interchangeable. In FIGS. 7A-9B, the "A" figures are plan views (viewed from the above) and the "B" figures are cross sectional views corresponding to line L2-L2 of FIG. 7A. Materials, configurations, dimensions, structures, conditions and operations the same as or similar to those explained with respect to FIGS. 1A-6B may be employed in the following embodiments, and some of the explanations may be omitted.

Figure 9A:
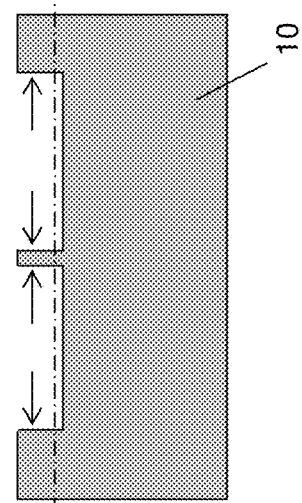
FIG. 9A illustrates a plan view of one of the various stages of manufacturing operations in accordance with an embodiment of the present disclosure.
Figure 9B:
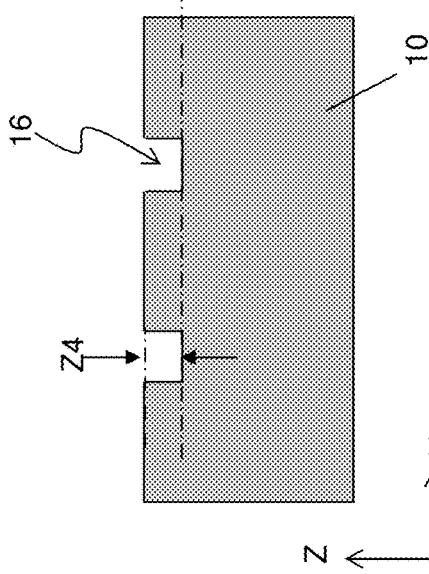
FIG. 9B illustrates a cross sectional view corresponding to line L2-L2 of FIG. 7A.

In this embodiment, hole patterns 16 are formed in the surface portion of the target layer 10, by operations similar to those explained with respect to FIGS. 2A-4B. The hole pattern 16 has a diameter X4 and a depth Z4, as shown in FIG. 7B. Then, similar to FIGS. 5A and 5B, one or more directional etching operations in the X direction are performed, to enlarge the hole patterns 16 by an amount D3 and an amount D4, thereby forming trenches 18, as shown in FIGS. 8A and 8B and FIGS. 9A and 9B. In some embodiments, D3 is equal to D4 and in other embodiments, D3 is different from D4. Similar to FIGS. 6A and 6B, the trench 18 has a length X5, a width Y5 and a depth Z5, as shown in FIGS. 9A and 9B. The length X5 is equal to X4+D3+D4. The difference Dy between widths Y5 and X4 is equal to or greater than zero and smaller than (D3+D4)/2. In some embodiments, (D3+D4)/2 is two times or more, five times or more, or ten times or more Dy. In some embodiments, Z5 is greater than Z4 and ½ or less, ⅕ or less or 1/10 or less (D3+D4)/2.

FIGS. 10A-12B shows plan views and cross sectional views of various stages for manufacturing a semiconductor device in accordance with another embodiment of the present disclosure. It is understood that additional operations can be provided before, during, and after processes shown by FIGS. 10A-12B, and some of the operations described below can be replaced or eliminated, for additional embodiments of the method. The order of the operations/processes may be interchangeable. In FIGS. 10A-12B, the "A" figures are plan views (viewed from the above) and the "B" figures are cross sectional views corresponding to line L3-L3 of FIG. 10A. Materials, configurations, dimensions, structures, conditions and operations the same as or similar to those explained with respect to FIGS. 1A-9B may be employed in the following embodiments, and some of the explanations may be omitted.

Figure 7A:
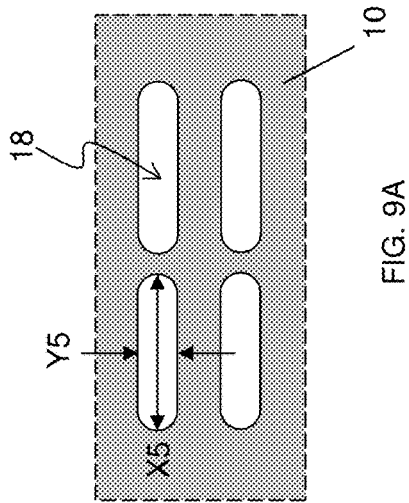
FIG. 7A illustrates a plan view of one of the various stages of manufacturing operations in accordance with an embodiment of the present disclosure.
Figure 8A:
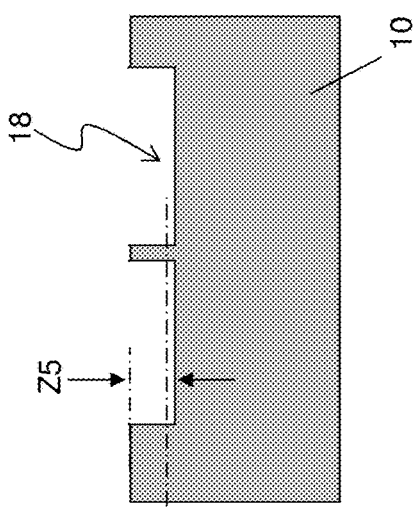
FIG. 8A illustrates a plan view of one of the various stages of manufacturing operations in accordance with an embodiment of the present disclosure.
Figure 7B:
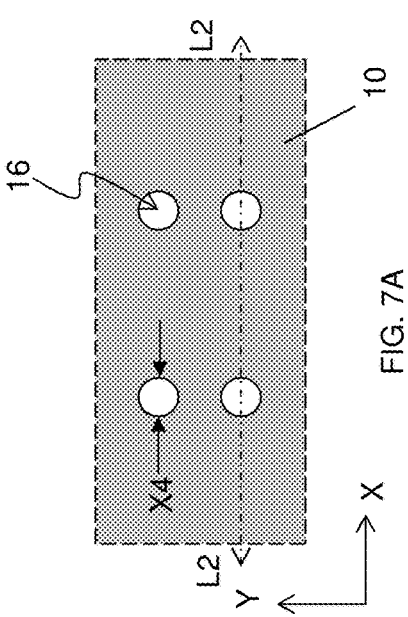
FIG. 7B illustrates a cross sectional view corresponding to line L2-L2 of FIG. 7A.
Figure 8B:
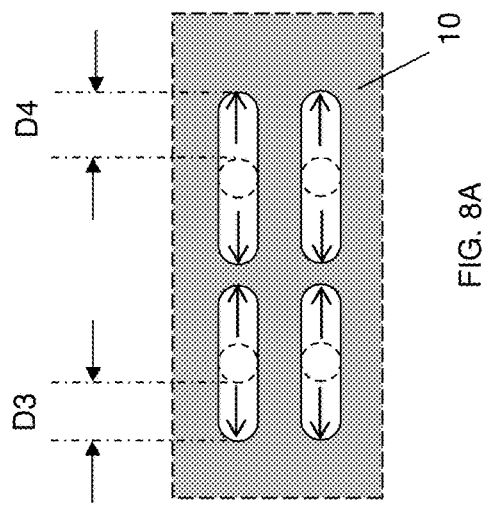
FIG. 8B illustrates a cross sectional view corresponding to line L2-L2 of FIG. 7A.
Figure 10A:
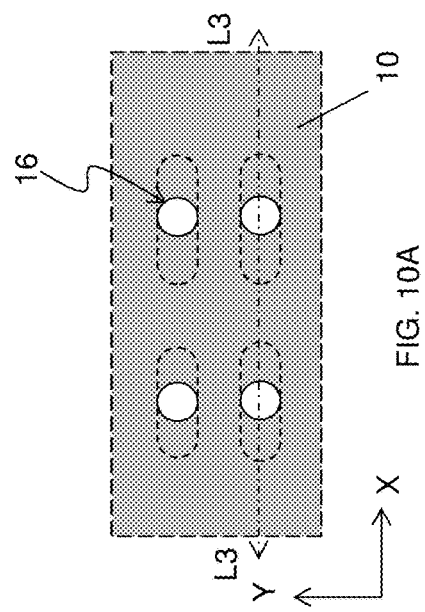
FIG. 10A illustrates a plan view of one of the various stages of manufacturing operations in accordance with an embodiment of the present disclosure.
Figure 11A:
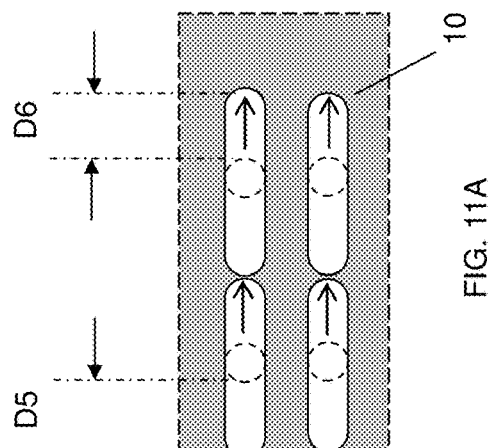
FIG. 11A illustrates a plan view of one of the various stages of manufacturing operations in accordance with an embodiment of the present disclosure.
Figure 12A:
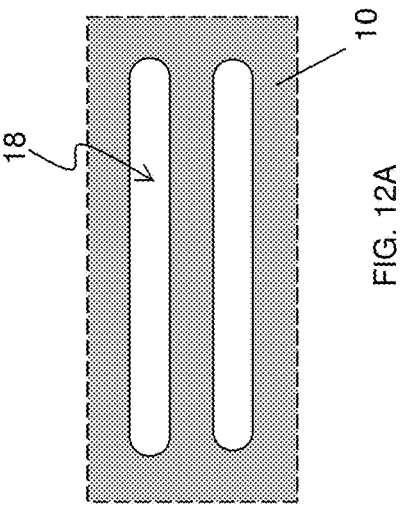
FIG. 12A illustrates a plan view of one of the various stages of manufacturing operations in accordance with an embodiment of the present disclosure.
Figure 10B:
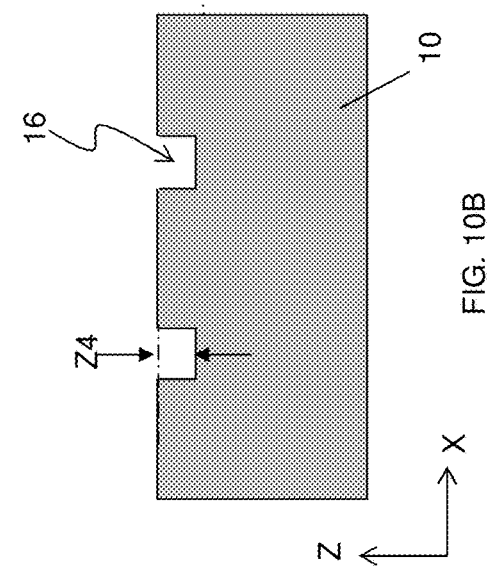
FIG. 10B illustrates a cross sectional view corresponding to line L3-L3 of FIG. 10A.
Figure 11B:
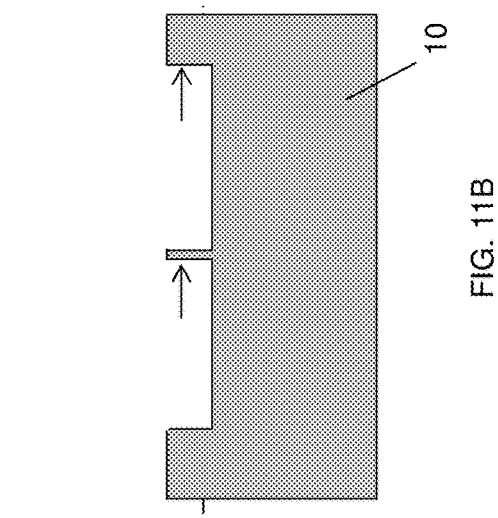
FIG. 11B illustrates a cross sectional view corresponding to line L3-L3 of FIG. 10A.
Figure 12B:
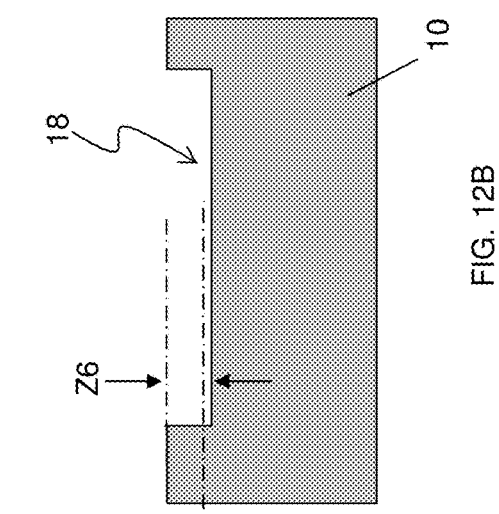
FIG. 12B illustrates a cross sectional view corresponding to line L3-L3 of FIG. 10A.

FIGS. 10A and 10B are substantially the same as FIGS. 7A and 7B (for hole patterns) or FIGS. 4A and 4B (short trench patterns). After hole/trench patterns are formed in the surface portion of the target layer 10 as shown in FIGS. 10A and 10B, one or more directional etching operations in the X direction are performed as shown in FIGS. 11A and 11B. By the directional etching, the adjacent trenches are merged to form one large trench 18 as shown in FIGS. 12A and 12B. In some embodiments, three or more opening patterns (holes) are merged into one large trench. In other embodiments, the original pattern is a space or a trench instead of a hole.

FIGS. 13A and 13B show plan views of patterns in accordance with an embodiment of the present disclosure. FIG. 13A corresponds to FIG. 4A and FIG. 13B corresponds to FIG. 6A. Similarly, FIGS. 13C, 13D and 13E show plan views of patterns in accordance with embodiments of the present disclosure. FIG. 13C corresponds to FIG. 7A, FIG. 13D corresponds to FIG. 9A and FIG. 13E corresponds to FIG. 12A.

FIGS. 14A and 14B show schematic plan views explaining how to make trench (space) patterns having a pitch smaller than the resolution limit of a lithography operation by using a directional etching in accordance with an embodiment of the present disclosure. Materials, configurations, dimensions, structures, conditions and operations the same as or similar to those explained with respect to FIGS. 1A-12B may be employed in the following embodiments, and some of the explanations may be omitted.

In FIG. 14A, three hole patterns RP1, RP2 and RP3 similar to hole patterns 16 of FIG. 7A are formed on or in the target layer. The hole patterns RP1 and RP2 are arranged with a pitch P along the Y direction. In FIG. 14A, line La passes the center of the hole pattern RP1 and is parallel to the X direction, and line Lb passes the centers of the hole patterns RP1 and RP2 and is parallel to the Y direction. Line Lc passes the centers of the hole patterns RP1 and RP3 and forms an angle θ (0°<θ<90°) with the line La. Line Ld passes the center of the hole pattern RP2 and is parallel with the X direction and line Le passes the center of the hole pattern RP3 and is parallel with the X direction. As shown in FIG. 14A, the distance between the lines La and Ld is equal to the pitch P, and the distance between the line La and line Le is P·sin θ.

After the directional etching operations along the ±X directions, the hole patterns RP1, RP2 and RP3 are modified into trench patterns TP1, TP2 and TP3 as shown in FIG. 14B. As shown in FIG. 14B, the pitch between the trenches TP1 and TP3 is P·sin θ, which is smaller than the pitch P. If the pitch P is equal to the resolution limit of the lithography operation with a single exposure, the present embodiment can provide trench patterns having a pitch smaller than the resolution limit of the lithography operation with a single exposure. In other words, the combination of a single exposure of a lithography operation and directional etching operations can form trench patterns having a pitch smaller than the resolution limit of the lithography operation.

FIGS. 15A-18B show various stages of manufacturing trench patterns for a semiconductor device in accordance with an embodiment of the present disclosure. It is understood that additional operations can be provided before, during, and after processes shown by FIGS. 15A-18B, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1A-14B may be employed in the following embodiments, and some of the explanations may be omitted.

FIG. 15A shows a pattern layout for one metal wiring layer and one via hole layer disposed below or over the metal wiring layer, and FIG. 15B shows only the pattern layer for the metal wiring layer. As shown in FIGS. 15A and 15B, the wiring patterns extend in the X direction in some embodiments. Wiring patterns in the metal wiring layer just below or above the metal wiring layer extend in the Y direction in some embodiments. The via holes connect the wiring patterns of the metal wiring layer to wiring patterns in other metal wiring layers. The conductive patterns of the metal wiring layer are formed by using a damascene technology in some embodiments. In a damascene technology, trenches are formed in a dielectric layer and the trenches are filled with a conductive material.

As shown in FIG. 15B, the wiring patterns are arranged on virtual lines VL (design grids) extending in the X direction. Then, as shown in FIG. 16A, reference patterns RP are generated to be arranged on the virtual lines VL as a simple matrix or a zig-zag (or staggered) matrix. In certain embodiments, as shown in FIG. 16A, the reference patterns RP are arranged in a zig-zag matrix. The minimum pitch Pm of the reference patterns is equal or close to the resolution limit of the lithography operation for making reference patterns over an actual substrate.

Figure 16B:
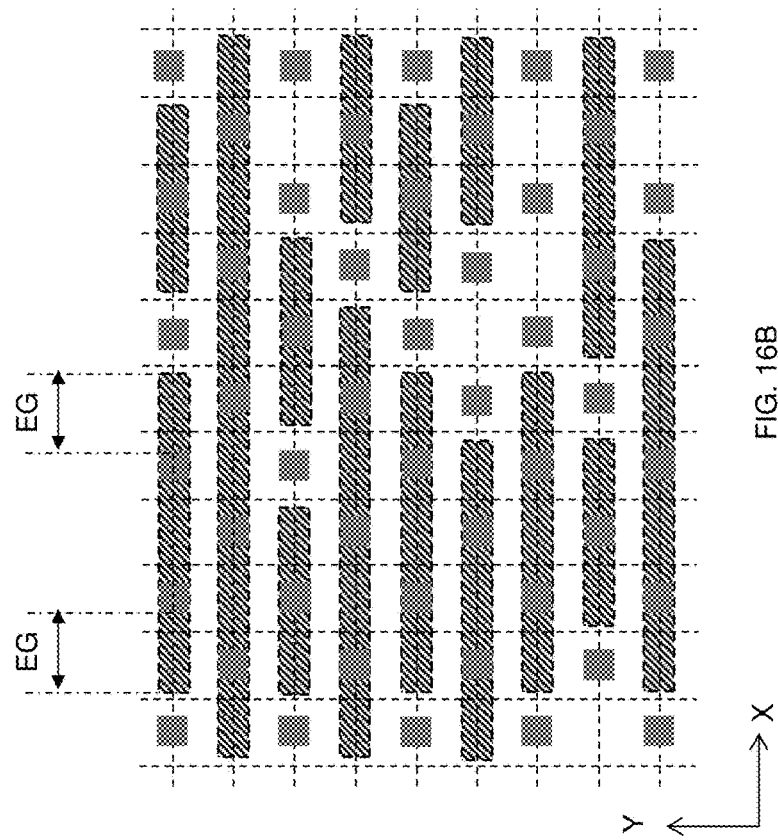
FIG. 16B shows a layout of reference patterns and circuit patterns for a semiconductor device in accordance with an embodiment of the present disclosure.
Figure 16A:
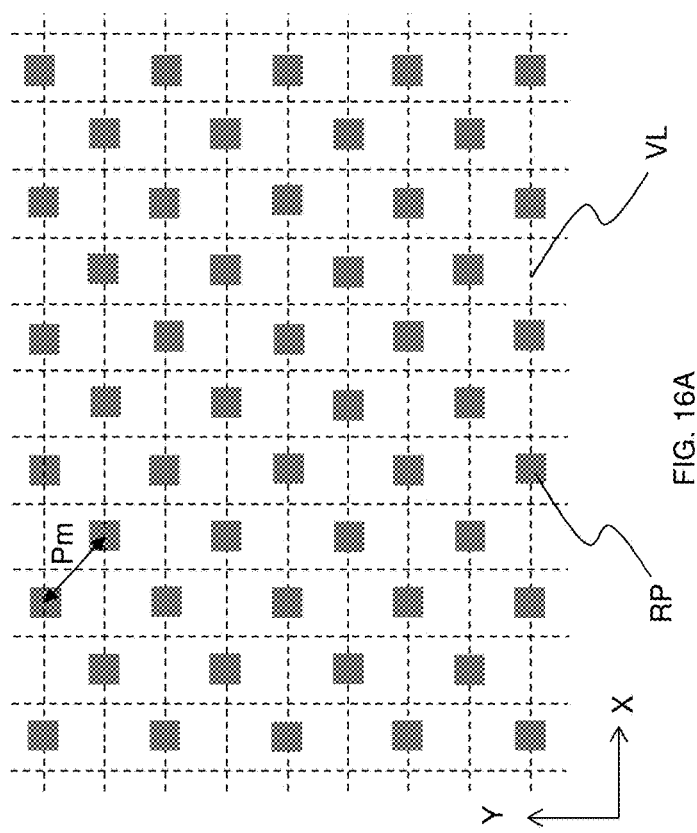
FIG. 16A shows a layout of reference patterns for a semiconductor device in accordance with an embodiment of the present disclosure.

FIG. 16B shows a pattern layout in which the wiring patterns shown in FIG. 15B and the reference patterns shown in FIG. 16A are shown at the same time. As shown in FIG. 16B, some of the reference patterns overlap the wiring patterns. The design rule restricts the reference patterns and/or the wiring patterns such that the wiring patterns are arranged to overlap at least one reference pattern, and edge distances EG between the edges of the wiring patterns to the adjacent overlapping reference patterns are the same for all patterns.

Figure 17:
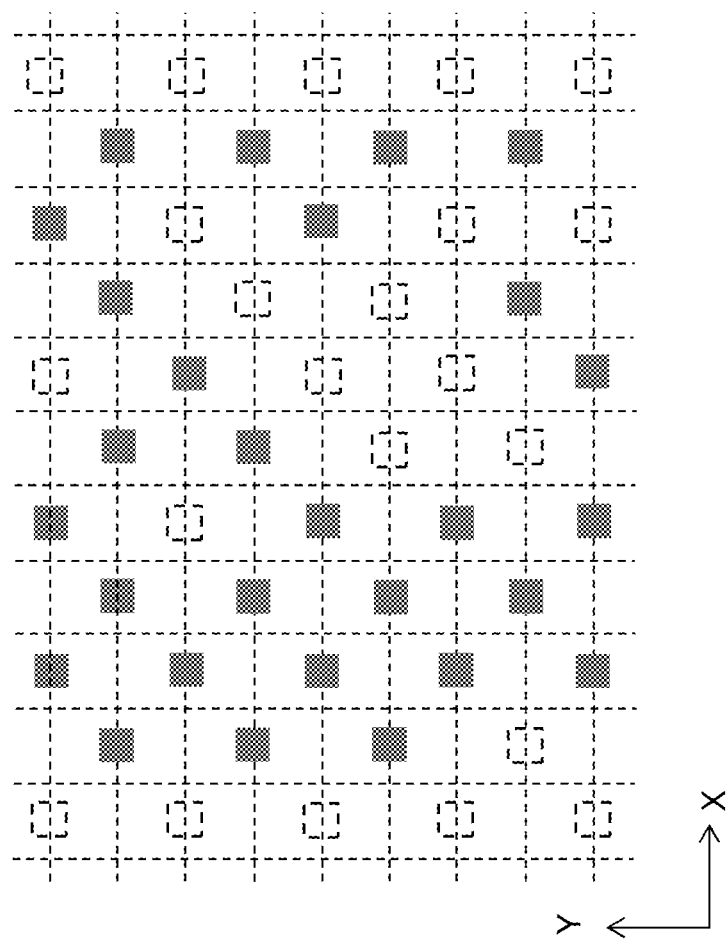
FIG. 17 shows a layout of reference patterns for a photo mask in accordance with an embodiment of the present disclosure.

Then, the overlapping reference patterns are extracted by a logical operation of the layout pattern of FIG. 15B and the layout pattern of FIG. 15A, as shown in FIG. 17. Based on the layout pattern as shown in FIG. 17, photo mask data or electron beam exposure data is generated. Then, a photo mask is formed by using the photo mask data.

Figure 18B:
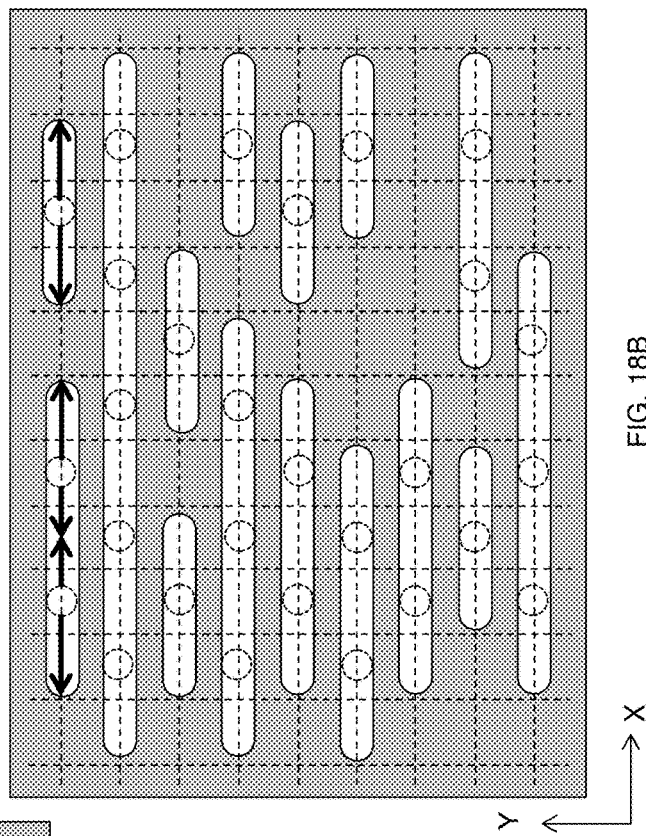
FIG. 18B shows a plan view after a directional patterning operation in accordance with an embodiment of the present disclosure.
Figure 18A:
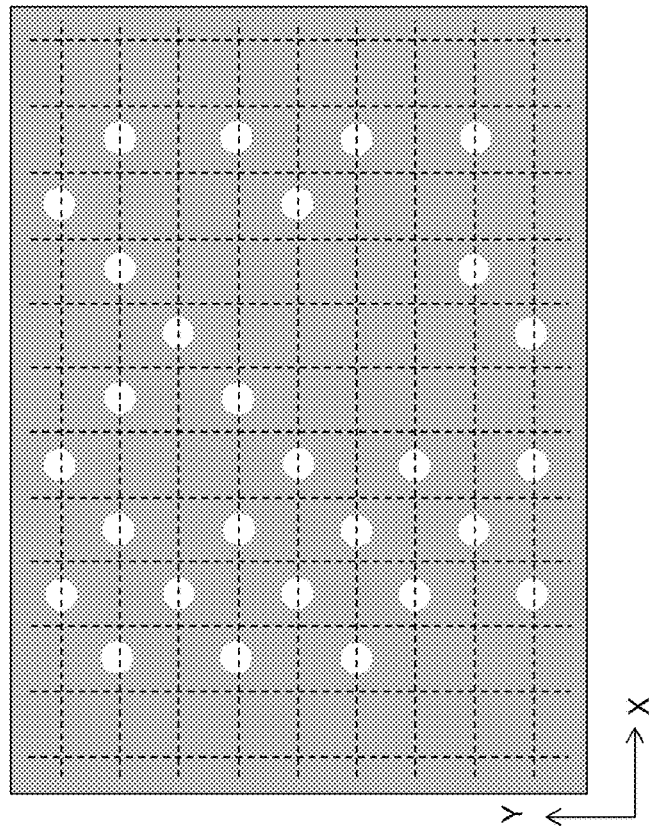
FIG. 18A shows a plan view after a patterning operation in accordance with an embodiment of the present disclosure.

FIG. 18A shows a plan view after hole patterns are formed in a dielectric layer by using one or more lithography and etching operations. Then, one or more directional etching operations along the X direction are performed to extend the hole patterns into trench patterns, as shown in FIG. 18B. By adjusting the etching amount in one direction (+X or −X) to be substantially the same as the edge distance EG shown in FIG. 16B, the trench patterns corresponding to the wiring patterns (layout) shown in FIG. 16B can be obtained.

As set forth above, the minimum pitch Pm of the reference patterns is defined as an oblique distance as shown in FIG. 16B, and the pitch of the trench patterns can be smaller than the resolution limit of the lithography operation.

Figure 19:
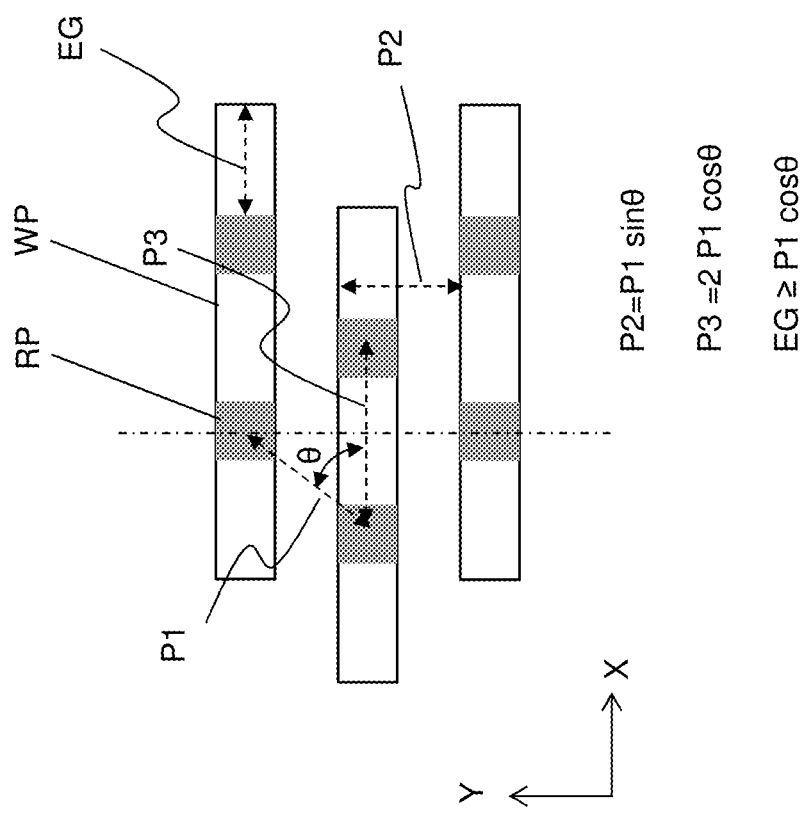
FIG. 19 shows relationship between a pattern pitch and reference openings in accordance with an embodiment of the present disclosure.

FIG. 19 shows the relationship between the wiring patterns WP and the reference patterns RP on the layout. In FIG. 19, the minimum pitch of the reference patterns RP is set to P1, which is determined by the resolution limit of the optical lithography and the etching operations to etch the dielectric layer. The pitch P2 of the wiring patterns WP can be set to $P1 \cdot \sin \theta$ or slightly larger consider a process margin (e.g., about 0.5 nm to about 2 nm). If the desired pitch P2 of the wiring pattern is set, $\theta$ is adjusted to maintain patternability of the reference patterns RP.

In some embodiments, the pitch P3 between two adjacent reference patterns is set to $2 \cdot P1 \cdot \cos \theta$ or slightly larger (by about 1 nm to about 5 nm). In some embodiments, the edge distance EG is $0.5 \cdot P3$ (i.e., $P1 \cdot \cos \theta$) or larger by an amount of 1 nm to about 5 nm. In certain embodiments, the edge distance EG is smaller than a distance between two adjacent reference patterns.

FIGS. 20A-20D show various stages of manufacturing metal wirings for a semiconductor device in accordance with an embodiment of the present disclosure. It is understood that additional operations can be provided before, during, and after processes shown by FIGS. 20A-20D, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1A-19 may be employed in the following embodiments, and some of the explanations may be omitted.

As shown in FIG. 20A, a conductive plug (e.g., via) 40 is embedded in a dielectric layer 11 formed over a lower conductive layer 6. In some embodiments, the lower conductive layer 6 is a semiconductor substrate and in other embodiments, the lower conductive layer is a metal wiring. The conductive plug 40 and a metal wiring includes a metallic material selected from the group consisting of W, Cu, Ti, Ag, Al, TiAl, TiN, TaN, TiAlN, TaC, TaCN, TaSiN, Mn, Co, Pd, Ni, Re, Ir, Ru, Pt, and Zr, in some embodiments. In some embodiments, as shown in FIG. 20A, the conductive plug is connected to the lower conductive layer 6. The dielectric layer 11 includes one or more layers of silicon oxide, silicon nitride, SiON, SiOC, SiOCN, SiCN, aluminum based dielectric material, low-k material, organic material, or any other dielectric material used in a semiconductor device fabrication.

As shown in FIG. 20A, one or more opening patterns 42 are formed at the surface of the dielectric layer 11 by using one or more lithography operations. Then, as shown in FIG. 20B, the opening patterns 42 are expanded along the X direction by using one or more directional etching operations. In some embodiments, as shown in FIG. 20C, two or more adjacent expanded openings are merged to form a trench 45 in which the upper surface of the conductive plug 40 is exposed. Then, as shown in FIG. 20D, the trench is filled with a metallic material selected from the group consisting of W, Cu, Ti, Ag, Al, TiAl, TiN, TYaN, TiAlN, TaC, TaCN, TaSiN, Mn, Co, Pd, Ni, Re, Ir, Ru, Pt, and Zr, in some embodiments.

FIGS. 21A-21F show various stages of manufacturing metal wrings for a semiconductor device in accordance with an embodiment of the present disclosure. It is understood that additional operations can be provided before, during, and after processes shown by FIGS. 21A-21F, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1A-20D may be employed in the following embodiments, and some of the explanations may be omitted.

In this embodiment, a hard mask is used to etch the dielectric layer. As shown in FIG. 21A, a hard mask layer 60 is formed over the dielectric layer 11. The conductive plug 40 is disposed on the lower conductive layer 6 and embedded in the dielectric layer 11, similar to FIG. 20A. The hard mask layer 60 is made of a different material than the dielectric layer 11 and includes one or more layers of silicon oxide, silicon nitride, SiON, SiOC, SiOCN, SiCN, aluminum based dielectric material, metallic material (e.g., TiN, Ti, or TaN), or any other dielectric material used in a semiconductor device fabrication. The first hard mask layer 60 can be formed by physical vapor deposition (PVD), chemical vapor deposition (CVD), or atomic layer deposition (ALD), although any acceptable process may be utilized.

As shown in FIG. 21B, one or more opening patterns 62 are formed in the hard mask layer 60 by using one or more lithography operations. Then, as shown in FIG. 21C, the opening patterns 62 are expanded along the X direction by using one or more directional etching operations. In some embodiments, as shown in FIG. 21D, two or more adjacent expanded openings are merged to form a trench 65. Then, the dielectric layer 11 is etched by using the hard mask layer 60 as an etching mask, such that the upper surface of the conductive plug 40 is exposed in a trench 67, as shown in FIG. 21E. Then, as shown in FIG. 21F, the trench 67 is filled with a metallic material, similar to FIG. 20D, and the hard mask layer 60 is removed. In some embodiments, the hard mask layer 60 is not removed.

FIGS. 22A-22F show various stages of manufacturing metal wrings for a semiconductor device in accordance with an embodiment of the present disclosure. It is understood that additional operations can be provided before, during, and after processes shown by FIGS. 22A-22F, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1A-21F may be employed in the following embodiments, and some of the explanations may be omitted.

In this embodiment, two hard mask layers are used to etch the dielectric layer. As shown in FIG. 22A, a first hard mask layer 60 is formed over the dielectric layer 11, and a second hard mask layer 70 is formed over the first hard mask layer 60. The conductive plug 40 is disposed on the lower conductive layer 6 and embedded in the dielectric layer 11, similar to FIGS. 20A and 10A. The first and/or second hard mask layers 60, 70 are made of a different material than the dielectric layer 11 and includes one or more layers of silicon oxide, silicon nitride, SiON, SiOC, SiOCN, SiCN, aluminum based dielectric material, metallic material (e.g., TiN, Ti, or TaN), or any other dielectric material used in a semiconductor device fabrication. The first and second hard mask layers 60, 70 are made of a different material from each other. The first and/or second hard mask layers 60, 70 can be formed by PVD, CVD, or ALD, although any acceptable process may be utilized. In some embodiments, the second hard mask layer 70 is a bottom layer used in a tri-layer resist system in a lithography operation, and is made of an organic material.

As shown in FIG. 22B, one or more opening patterns 72 are formed in the first and second hard mask layers by using one or more lithography operations. Then, as shown in FIG. 22C, the opening patterns 72 are expanded along the X direction by using one or more directional etching operations. In some embodiments, as shown in FIG. 22D, two or more adjacent expanded openings are merged to form a trench 75. Then, the dielectric layer 11 is etched by using the first and/or second hard mask layers as an etching mask, such that the upper surface of the conductive plug 40 is exposed in a trench 77, as shown in FIG. 22E. Then, as shown in FIG. 22F, the trench 77 is filled with a metallic material, similar to FIG. 20D, and the first and second hard mask layers are removed. In some embodiments, the hard mask layers are not removed.

FIGS. 23A and 23B show advantageous effect of the use of two hard mask layers and a directional etching operation in accordance with an embodiment of the present disclosure. Materials, configurations, dimensions, structures, conditions and operations the same as or similar to those explained with respect to FIGS. 1A-22F may be employed in the following embodiments, and some of the explanations may be omitted.

As shown in FIG. 23A, a mask pattern 80 includes a first hard mask layer 61 formed over a dielectric layer 19, and a second hard mask layer 71 formed over the first hard mask layer 61. In some embodiments, the second hard mask layer 71 is a bottom layer used in a tri-layer-resist system in a lithography operation, and is made of an organic material. The first hard mask layer is made of silicon oxide formed from tetraethyl orthosilicate (TEOS) or silicon nitride.

As shown in FIG. 23A, a plasma flow having an oblique angle θ (plasma incident angle) with respect to the normal direction is applied. By adjusting the angle θ and/or an etching selectivity between the first hard mask layer 61 and the second hard mask layer 71, it is possible to modify a pattern profile (vertical profile) of the mask pattern 80, as shown in FIG. 23B.

In some embodiments, due to lithography and/or etching conditions, the pattern profile of the mask pattern 80 has a tapered shaped. In some embodiments, the plasma incident angle θ is set to about 5 to about 15 degrees to remove the tapers from the mask pattern 80. When the plasma incident angle θ is smaller than 5 degrees, an etching amount of the side of the first mask layer 61 would be small, and when the plasma incident angle θ is greater than 30 degrees, the pattern profiled of the mask pattern 80 would be a T-shape.

FIGS. 24A-30B show various stages of manufacturing trench patterns for a semiconductor device in accordance with an embodiment of the present disclosure. It is understood that additional operations can be provided before, during, and after processes shown by FIGS. 24A-30B, and some of the operations described below can be replaced or eliminated, for additional embodiments of the method. The order of the operations/processes may be interchangeable. In FIGS. 24A-30B, the "A" figures are plan views (viewed from the above) and the "B" figures are cross sectional views corresponding to line L4-L4 of FIGS. 24A, 25A and 26A or line L5-L5 of FIGS. 27A, 28A, 29A and 30A. Materials, configurations, dimensions, structures, conditions and operations the same as or similar to those explained with respect to FIGS. 1A-23B may be employed in the following embodiments, and some of the explanations may be omitted.

As shown in FIGS. 24A and 24B, a first hard mask layer 115 is formed over a lower layer 110. The lower layer 110 is a dielectric layer in some embodiments, and is a conductive layer including a metallic layer, a polysilicon layer or a semiconductor substrate in other embodiments. Further, a bi-layer or tri-layer resist is disposed on the first hard mask layer and a first opening 122 is formed in the resist layer. In some embodiments, the resist layer is a bi-layer resist system including a bottom layer 120 and a photo resist layer 125. In some embodiments, the first hard mask layers 115 include one or more layers of silicon oxide, silicon nitride, SiON, SiOC, SiOCN, SiCN, aluminum based dielectric material, metallic material (e.g., TiN, Ti, or TaN), or any other dielectric material used in a semiconductor device fabrication. The first hard mask layer 115 can be formed by PVD, CVD, or ALD, although any acceptable process may be utilized. The bottom layer 120 includes an organic material or a low-k material in some embodiments.

After the first opening 122 is formed, a second opening 124 is formed in the first hard mask layer 115 using one or more etching operations, as shown in FIGS. 25A and 25B. Then, resist layers 120 and 125 are removed.

Next, as shown in FIGS. 26A and 26B, s second hard mask layer 130 is formed in the second opening 124, by using one or more film deposition and planarization operations (e.g., chemical mechanical polishing (CMP)). The second hard mask layer 130 is made of a different material than the first hard mask layer 115 and includes one or more layers of silicon oxide, silicon nitride, SiON, SiOC, SiOCN, SiCN, aluminum based dielectric material, metallic material (e.g., TiN, Ti, or TaN), or any other dielectric material used in a semiconductor device fabrication. The second hard mask layer 130 can be formed by PVD, CVD, or ALD, although any acceptable process may be utilized.

Then, another resist layer is formed over the first and second hard mask layers, and then one of more third openings 142 are formed in the resist layer, as shown in FIGS. 27A and 27B. The resist layer can be a bi-layer or tri-layer resist system in some embodiments. In certain embodiments, the resist layer is a bi-layer resist system including a bottom layer 135 and a photo resist layer 140. The bottom layer 135 includes an organic material or a low-k material in some embodiments. As shown in FIG. 28A, the third openings are hole patterns in some embodiments. In other embodiments, the third openings are short trench patterns.

Next, as shown in FIGS. 28A and 28B, the first hard mask layer 115 is patterned by using the resist layers 135 and 140 to form fourth openings 144, and the photo resist layer 140 is removed.

Subsequently, one or more directional etching operations are performed in the X directions, and thus long trenches 150 are formed, as shown in FIGS. 29A and 29B. In the directional etching, since the etching rate of the first mask layer 115 is selected to be faster than the etching rate of the second hard mask layer 130, the directional etching operation to the −X direction stops at the second hard mask layer 130.

After the bottom layer 140 is removed, trenches 150 are formed in the first hard mask layer as shown in FIGS. 30A and 30B. By using the second hard mask layer 130, it is possible to control the end positions of the trenches. In some embodiments, the second hard mask layer 130 is subsequently removed.

FIGS. 31A-31C and FIGS. 32A-32C show plan views of other embodiments using the second hard mask layers to control end positions of the trenches. It is understood that additional operations can be provided before, during, and after processes shown by FIGS. 31A-31C and FIGS. 32A-32C, and some of the operations described below can be replaced or eliminated for additional embodiments of the method. The order of the operations/processes may be interchangeable. Materials, configurations, dimensions, structures, conditions and operations the same as or similar to those explained with respect to FIGS. 1A-30B may be employed in the following embodiments, and some of the explanations may be omitted.

As shown in FIG. 31A, the second hard mask pattern 130 are line-and-space patterns with the same line width and the same space widths and are embedded in the first hard mask layer 115, similar to FIGS. 26A and 26B. Then, as shown in FIG. 31B, one or more openings 144 are formed, similar to FIGS. 28A and 28B. Further, the openings 144 are expanded in the X direction by one or more directional etching operations to form long trenches 150, and the bottom layer 135 is removed, as shown in FIG. 31C. Since the second hard mask layers 130 are used, the width of the trenches 150 in the Y direction is restrained by the space between the second hard mask layers 130.

Similarly, as shown in FIG. 32A, the second hard mask patterns 130 are line-and-space patterns with various line widths and/or various space widths, and are embedded in the first hard mask layer 115, similar to FIGS. 26A and 26B. Then, as shown in FIG. 32B, one or more openings 144 are formed, similar to FIGS. 28A and 28B. In some embodiments, the openings 144 include one or more hole patterns and/or one or more space patterns extending in the Y direction, as shown in FIG. 32B. One or more spaces are disposed over two or more second hard mask patterns 130. Further, the openings 144 are expanded in the X directions by one or more directional etching operations to form long trenches 150, and the bottom layer 135 is removed, as shown in FIG. 32C. Since the second hard mask layers 130 are used, the width of the trenches 150 in the Y direction is restrained by the space between the second hard mask layers 130. Further, even if the spaces 144 are disposed over two or more second hard mask patterns 130, the second mask patterns 130 are not etched in the directional etching, and the trench patterns restrained by the second mask patterns 130 can be obtained. As shown in FIG. 32C, ends of some of the trenches are straight in the Y direction and ends of some of the trenches are semi-circular or curved.

FIGS. 33A-35B and FIGS. 36A-37B show various views of directional deposition operations according to embodiments of the present disclosure. It is understood that additional operations can be provided before, during, and after processes shown by FIGS. 33A-35B and FIGS. 36A-37B, and some of the operations described below can be replaced or eliminated for additional embodiments of the method. The order of the operations/processes may be interchangeable. Materials, configurations, dimensions, structures, conditions and operations the same as or similar to those explained with respect to FIGS. 1A-32C may be employed in the following embodiments, and some of the explanations may be omitted. In FIGS. 33A-35B, the "A" figures are plan views (viewed from the above) and the "B" figures are cross sectional views corresponding to line L6-L6 of FIGS. 33A, 34A and 35A or line L7-L7 of FIGS. 36A and 37A.

Figure 33A:
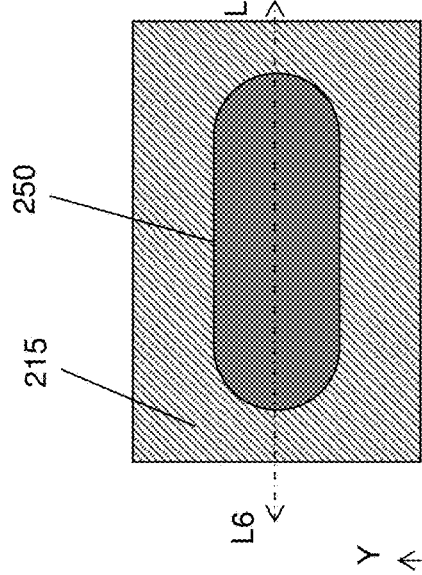
FIG. 33A illustrates a plan view of one of the various stages of manufacturing operations in accordance with an embodiment of the present disclosure.
Figure 33B:
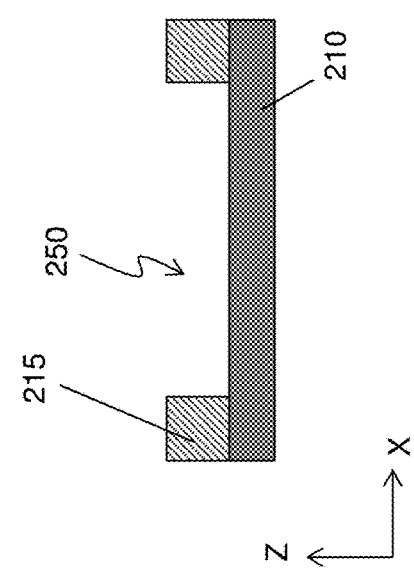
FIG. 33B illustrates a cross sectional view corresponding to line L6-L6 of FIG. 33A.

As shown in FIGS. 33A and 33B, a trench or an opening 250 is formed in the first layer 215 over a lower layer 210. The lower layer 210 is a dielectric layer in some embodiments, and is a conductive layer including a metallic layer, a polysilicon layer or a semiconductor substrate in other embodiments. The first layer 215 includes one or more layers of silicon oxide, silicon nitride, SiON, SiOC, SiOCN, SiCN, aluminum based dielectric material, metallic material (e.g., TiN, Ti, or TaN), or any other dielectric material used in a semiconductor device fabrication. The first layer 215 can be formed by PVD, CVD, or ALD, although any acceptable process may be utilized. In some embodiments, the first layer 215 is a hard mask layer similar to the first hard mask layer 115.

Then, the dimension of the opening 250 is reduced by one or more directional deposition operations. Similar to a directional etching operation, by tuning various deposition parameters to generate depositing species (radicals, molecules, atoms, etc) that travel in a substantially horizontal direction or incident on the substrate with a large incident angle of more than about 70 degrees (where the angle of 90 degrees is horizontal). The deposition parameters to be tuned include, but are not limited to, deposition gas composition, deposition temperature, deposition time, deposition pressure, radio frequency (RF) bias voltage, RF bias power, gas flow rate, wafer tilting, other suitable parameters, or combinations thereof.

Figure 34A:
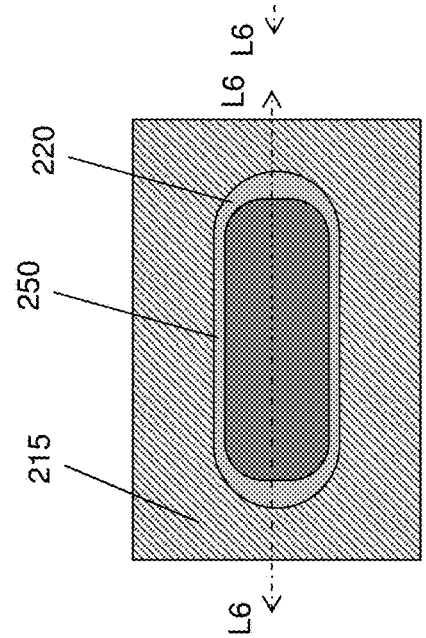
FIG. 34A illustrates a plan view of one of the various stages of manufacturing operations in accordance with an embodiment of the present disclosure.
Figure 34B:
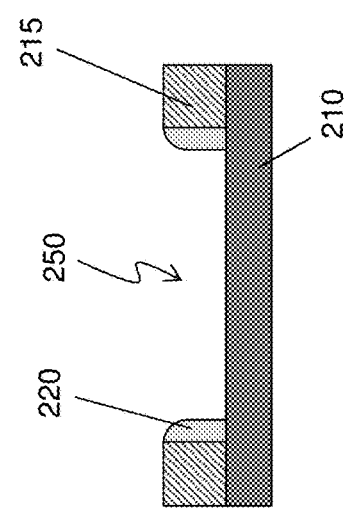
FIG. 34B illustrates a cross sectional view corresponding to line L6-L6 of FIG. 34A.

As shown in FIGS. 34A and 34B, the directional deposition operations are performed in the ±X directions. An amount of a deposited material 220 at ends of the opening 250 in the X direction is greater than an amount of a deposited material 220 at ends of the opening 250 in the Y direction. In some embodiments, the amount of the deposited material 220 at ends of the opening 250 in the X direction is twice or more, five times or more, or ten times or more (up to 100 times) the amount of the deposited material 220 at ends of the opening 250 in the Y direction.

Figure 35A:
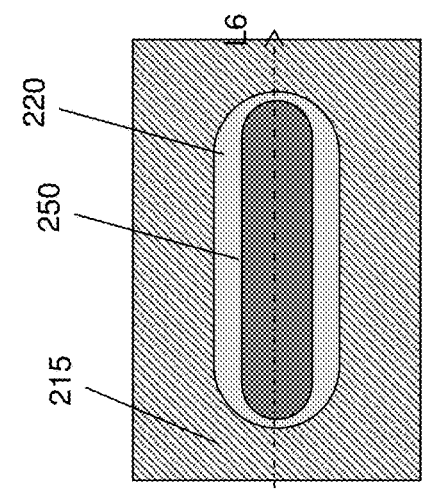
FIG. 35A illustrates a plan view of one of the various stages of manufacturing operations in accordance with an embodiment of the present disclosure.
Figure 35B:
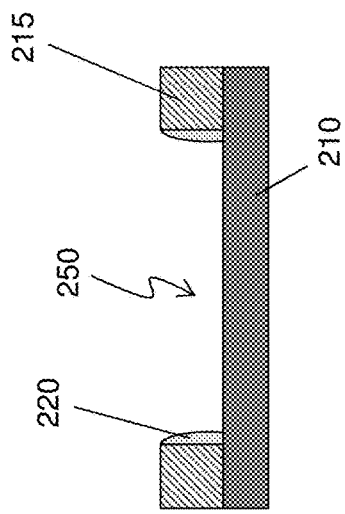
FIG. 35B illustrates a cross sectional view corresponding to line L6-L6 of FIG. 35A.

FIGS. 35A and 35B show the case of the directional deposition operations in the ±Y directions. An amount of a deposited material 220 at ends of the opening 250 in the Y direction is greater than an amount of a deposited material 220 at ends of the opening 250 in the X direction. In some embodiments, the amount of the deposited material 220 at ends of the opening 250 in the Y direction is twice or more, five times or more, or ten times or more (up to 100 times) the amount of the deposited material 220 at ends of the opening 250 in the X direction.

By a directional deposition operation or the combination of directional deposition and etching operations, it is possible to precisely adjust the dimensions of the openings in either or both of the X and/or Y directions. For example, the corner shape of the openings can be modified to have a smaller corner rounding, and the width of the opening (trench) can be reduced without substantially reducing the length of the trench.

Figure 36A:
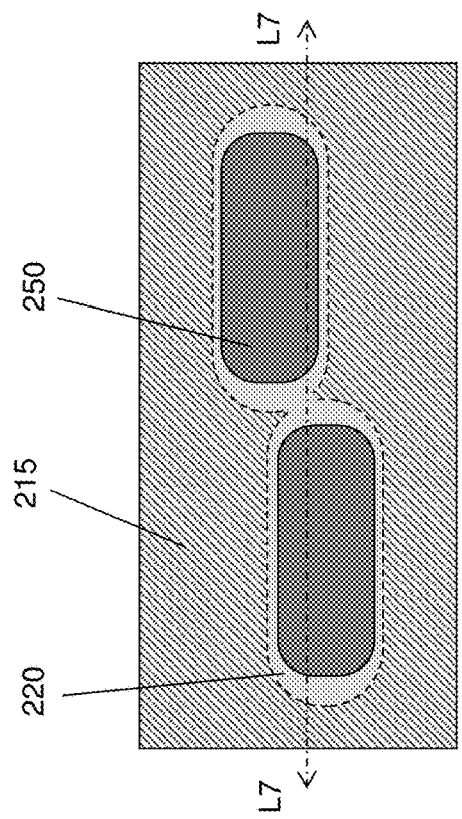
FIG. 36A illustrates a plan view of one of the various stages of manufacturing operations in accordance with an embodiment of the present disclosure.
Figure 36B:
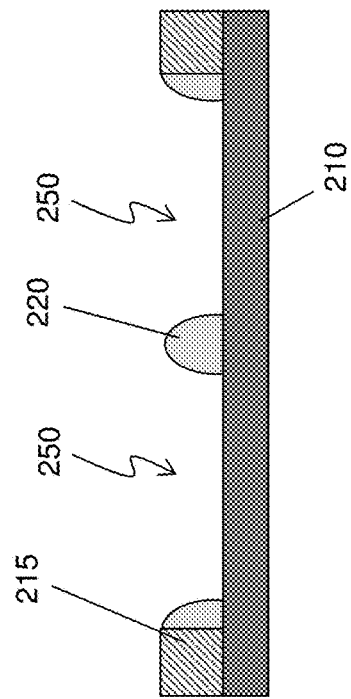
FIG. 36B illustrates a cross sectional view corresponding to line L7-L7 of FIG. 36A.
Figure 37A:
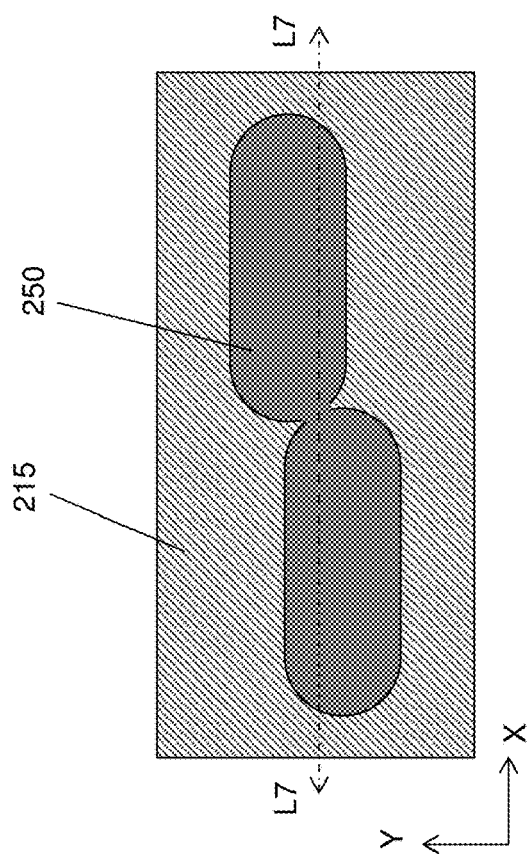
FIG. 37A illustrates a plan view of one of the various stages of manufacturing operations in accordance with an embodiment of the present disclosure.
Figure 37B:
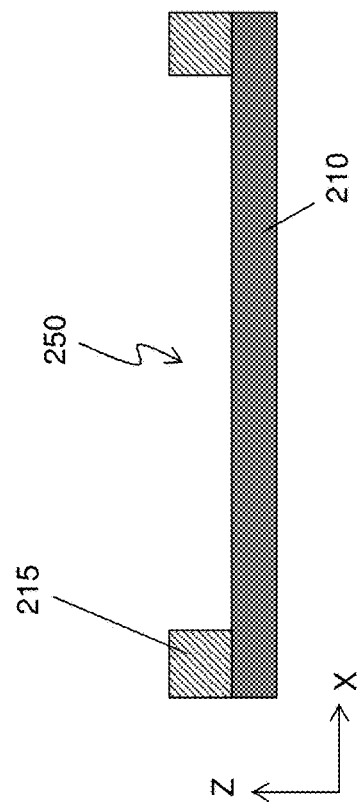
FIG. 37B illustrates a cross sectional view corresponding to line L7-L7 of FIG. 37A.

In FIGS. 36A to 37B, the directional deposition operations are used to repair pattern defects. As shown in FIGS. 36A and 36B, two openings 250 are merged due to over-etching in some embodiments. By applying one or more directional etching in the X direction, the bridged portion is separated by a deposited material 220, as shown in FIGS. 37A and 37B.

As set forth above, by using one or more directional patterning operations, it is possible to obtain patterns having smaller dimension than the resolution limit of a lithography operation with a single exposure.

It will be understood that not all advantages have been necessarily discussed herein, no particular advantage is required for all embodiments or examples, and other embodiments or examples may offer different advantages.

In accordance with an aspect of the present disclosure, in a method of forming a groove pattern extending in a first axis in an underlying layer over a semiconductor substrate, a first opening is formed in the underlying layer, and the first opening is extended in the first axis by one or more directional etching operations to form the groove pattern. In one or more of the foregoing and following embodiments, in the extending the first opening, an extending amount in one direction along the first axis is equal to an extending amount in another direction opposite to the one direction along the first axis. In one or more of the foregoing and following embodiments, in the directional etching, an etching rate of the underlying layer along the first axis is greater than an etching rate of the underlying layer along a second axis perpendicular to the first axis. In one or more of the foregoing and following embodiments, the etching rate of the underlying layer along the first axis is twice or more the etching rate of the underlying layer along the second axis perpendicular to the first axis. In one or more of the foregoing and following embodiments, the etching rate of the underlying layer along the first axis is five times or more the etching rate of the underlying layer along the second axis perpendicular to the first axis. In one or more of the foregoing and following embodiments, the etching rate of the underlying layer along the first axis is ten times or more the etching rate of the underlying layer along the second axis perpendicular to the first axis. In one or more of the foregoing and following embodiments, the first opening has a rounded-cornered rectangular shape extending in the first direction in plan view. In one or more of the foregoing and following embodiments, the first opening has a hole shape in plan view. In one or more of the foregoing and following embodiments, the underlying layer is made of dielectric material.

In accordance with another aspect of the present disclosure, in a method of forming a groove pattern extending in a first axis in an underlying layer over a semiconductor substrate, a first opening and a second opening are formed in the underlying layer. The first opening and the second opening are extended in the first axis by one or more directional etching operations so that the extended first opening and the extended second opening are connected to form the groove pattern. In one or more of the foregoing and following embodiments, in the extending the first opening, an extending amount in one direction along the first axis is equal to an extending amount in another direction opposite to the one direction along the first axis. In one or more of the foregoing and following embodiments, in the directional etching, an etching rate of the underlying layer along the first axis is greater than an etching rate of the underlying layer along a second axis perpendicular to the first axis. In one or more of the foregoing and following embodiments, the etching rate of the underlying layer along the first axis is twice or more the etching rate of the underlying layer along the second axis perpendicular to the first axis. In one or more of the foregoing and following embodiments, the etching rate of the underlying layer along the first axis is five to twenty times the etching rate of the underlying layer along the second axis perpendicular to the first axis. In one or more of the foregoing and following embodiments, the first and second openings have a rounded-cornered rectangular shape extending in the first direction in plan view. In one or more of the foregoing and following embodiments, the first and second openings have a circular shape in plan view. In one or more of the foregoing and following embodiments, the underlying layer is made of dielectric material.

In accordance with another aspect of the present disclosure, in a method of forming groove pattern extending in a first axis in an underlying layer over a semiconductor substrate, a resist pattern having a first opening pattern and second opening pattern is formed by a lithography operation. A first opening and a second opening are formed in the underlying layer by etching the underlying layer through the first opening pattern and the second opening pattern, respectively. The first opening and the second opening are extended in the first axis by one or more directional etching operations to form a first groove pattern expanded from the first opening and a second groove pattern expanded from the second opening. A minimum space or a pitch between the first groove and the second groove along a second axis perpendicular to the first axis is smaller than a minimum space or a pitch between the first opening pattern and the second opening pattern. In one or more of the foregoing and following embodiments, in the extending the first opening, an extending amount in one direction along the first axis is equal to an extending amount in another direction opposite to the one direction along the first axis. In one or more of the foregoing and following embodiments, the etching rate of the underlying layer along the first axis is 2 to 20 times the etching rate of the underlying layer along the second axis perpendicular to the first axis. In one or more of the foregoing and following embodiments, the first and second openings have a circular shape in plan view.

In accordance with another aspect of the present disclosure, in a method of forming a wiring pattern extending in a first axis in a dielectric layer over a semiconductor substrate, a first opening is formed in the underlying layer. The first opening is extended in the first axis by directional etching to form a groove pattern. The groove pattern is filled with a conductive material to form the wiring pattern.

In accordance with another aspect of the present disclosure, in a method of manufacturing a semiconductor device, first layout data are prepared for metal wiring patterns. Second layout data are prepared for reference patterns arranged in a matrix or a checker-board manner. Common reference patterns that overlap the metal wiring pattern among the core patterns are obtained by conducting a logical operation between the first layout data and the second layout data. A photo mask is manufactured from layout data of the common reference patterns. A resist pattern having a plurality of reference opening patterns are formed over an underlying layer by a lithography operation using the photo mask. A plurality of opening patterns are formed by etching the underlying layer through the plurality of reference opening patterns. The plurality of opening patterns are extended in a first axis by directional etching to form a plurality of groove patterns.

In accordance with another aspect of the present disclosure, in a method of forming an opening pattern extending in a first axis in an underlying layer over a semiconductor substrate, a first opening is formed in the underlying layer. A dimension of the first opening is modified in the first axis and a second axis crossing the first axis within a plane parallel to a surface of the semiconductor substrate by a directional pattern formation process to form the opening pattern. In an embodiment, the dimension of the first opening in the first axis is reduced by the directional pattern formation process.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a groove pattern extending in a first axis in an underlying layer over a semiconductor substrate, the first axis being horizontal and parallel to a surface of the semiconductor substrate, the method comprising:
    forming a first opening in the underlying layer; and
    extending the first opening in the first axis by one or more directional etching operations using plasma, which is horizontally anisotropic, to form the groove pattern having an upper opening over an entirety of the groove pattern,
    wherein in the directional etching, an etching rate of the underlying layer along the first axis is greater than an etching rate of the underlying layer along a second axis perpendicular to the first axis, the second axis being horizontal and parallel to the surface of the semiconductor substrate.

2. The method of claim 1, wherein in the extending the first opening, an extending amount in one direction along the first axis is equal to an extending amount in another direction opposite to the one direction along the first axis.

3. The method of claim 1, wherein the etching rate of the underlying layer along the first axis is ten time or more the etching rate of the underlying layer along the second axis perpendicular to the first axis.

4. The method of claim 1, wherein the etching rate of the underlying layer along the first axis is twice or more the etching rate of the underlying layer along the second axis perpendicular to the first axis.

5. The method of claim 1, wherein the etching rate of the underlying layer along the first axis is five times or more the etching rate of the underlying layer along the second axis perpendicular to the first axis.

6. The method of claim 1, wherein the first opening has a rounded-cornered rectangular shape extending in the first direction in plan view.

7. The method of claim 1, wherein the first opening has a circular shape in plan view.

8. The method of claim 1, wherein the underlying layer is made of dielectric material.

9. A method of forming a groove pattern extending in a first axis in an underlying layer over a semiconductor substrate, the first axis being horizontal and parallel to a surface of the semiconductor substrate, the method comprising:
    forming a first opening and a second opening in the underlying layer; and
    extending the first opening and the second opening in the first axis by one or more directional etching operations using plasma, which is horizontally anisotropic, so that the extended first opening and the extended second opening are connected to form the groove pattern having an upper opening over the groove other than the first opening and the second opening.

10. The method of claim 9, wherein in the extending the first opening, an extending amount in one direction along the first axis is equal to an extending amount in another direction opposite to the one direction along the first axis.

11. The method of claim 9, wherein in the directional etching, an etching rate of the underlying layer along the first axis is greater than an etching rate of the underlying layer along a second axis perpendicular to the first axis, the second axis being horizontal and parallel to the surface of the semiconductor substrate.

12. The method of claim 11, wherein the etching rate of the underlying layer along the first axis is twice or more the etching rate of the underlying layer along the second axis perpendicular to the first axis.

13. The method of claim 11, wherein the etching rate of the underlying layer along the first axis is five to twenty times the etching rate of the underlying layer along the second axis perpendicular to the first axis.

14. The method of claim 9, wherein the first and second openings have a rounded-cornered rectangular shape extending in the first direction in plan view.

15. The method of claim 9, wherein each of the first and second openings has a circular shape in plan view.

16. The method of claim 9, wherein the underlying layer is made of dielectric material.

17. A method of forming groove pattern extending in a first axis in an underlying layer over a semiconductor substrate, the method comprising:

forming a resist pattern having a first opening pattern and second opening pattern by a lithography operation;

forming a first opening and a second opening in the underlying layer by etching the underlying layer through the first opening pattern and the second opening pattern, respectively; and extending the first opening and the second opening in the first axis by one or more directional etching operations using plasma, which is horizontally anisotropic, to form a first groove pattern expanded from the first opening and a second groove pattern expanded from the second opening, wherein:

the first axis is horizontal and parallel to a surface of the semiconductor substrate, the first groove pattern has an upper opening over an entirety of the first groove pattern, and the second groove pattern has an upper opening over an entirety of the second groove pattern, and a minimum space or a pitch between the first groove and the second groove along a second axis perpendicular to the first axis and parallel to the surface of the semiconductor substrate, is smaller than a minimum space or a pitch between the first opening pattern and the second opening pattern.

18. The method of claim 17, wherein in the extending the first opening, an extending amount in one direction along the first axis is equal to an extending amount in another direction opposite to the one direction along the first axis.

19. The method of claim 17, wherein the etching rate of the underlying layer along the first axis is 2 to 20 times the etching rate of the underlying layer along a second axis perpendicular to the first axis.

20. The method of claim 17, wherein each of the first and second openings has a circular shape in plan view.

* * * * *